United States Patent
Onuki

(10) Patent No.: US 9,865,325 B2
(45) Date of Patent: *Jan. 9, 2018

(54) MEMORY DEVICE AND SEMICONDUCTOR DEVICE

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/296,309

(22) Filed: Oct. 18, 2016

(65) Prior Publication Data

US 2017/0040048 A1 Feb. 9, 2017

Related U.S. Application Data

(63) Continuation of application No. 14/679,111, filed on Apr. 6, 2015, now Pat. No. 9,478,276.

(30) Foreign Application Priority Data

| Apr. 10, 2014 | (JP) | ................................ 2014-080872 |
| Apr. 28, 2014 | (JP) | ................................ 2014-092831 |
| Sep. 4, 2014 | (JP) | ................................ 2014-180022 |

(51) Int. Cl.
*G11C 11/34* (2006.01)
*G11C 11/4091* (2006.01)
(Continued)

(52) U.S. Cl.
CPC ........ *G11C 11/4091* (2013.01); *G11C 7/1069* (2013.01); *G11C 11/4094* (2013.01);
(Continued)

(58) Field of Classification Search
CPC ............................ G11C 11/407; G11C 11/405
(Continued)

(56) References Cited

U.S. PATENT DOCUMENTS

| 5,534,884 A | 7/1996 | Mase et al. |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

International Search Report (Application No. PCT/IB2015/052387) dated Jun. 2, 2015.

(Continued)

*Primary Examiner* — Son Dinh

(74) *Attorney, Agent, or Firm* — Fish & Richardson P.C.

(57) ABSTRACT

Provided is a memory device with a reduced layout area. The memory device includes a sense amplifier electrically connected to first and second wirings and positioned in a first layer, and first and second circuits positioned in a second layer over the first layer. The first circuit includes a first switch being turned on and off in accordance with a potential of a third wiring, and a first capacitor electrically connected to the first wiring via the first switch. The second circuit includes a second switch being turned on and off in accordance with a potential of a fourth wiring, and a second capacitor electrically connected to the second wiring via the second switch. The first wiring intersects the third wiring and does not intersect the fourth wiring in the second layer. The second wiring intersects the fourth wiring and does not intersect the third wiring in the second layer.

19 Claims, 20 Drawing Sheets

(51) Int. Cl.
    *G11C 11/4097* (2006.01)
    *H01L 29/786* (2006.01)
    *H01L 27/108* (2006.01)
    *G11C 7/10* (2006.01)
    *G11C 11/4094* (2006.01)
    *G11C 29/04* (2006.01)

(52) U.S. Cl.
    CPC .......... *G11C 11/4097* (2013.01); *G11C 29/04* (2013.01); *H01L 27/10805* (2013.01); *H01L 29/7869* (2013.01)

(58) Field of Classification Search
    USPC ............................................ 365/149, 63, 51
    See application file for complete search history.

(56) References Cited

U.S. PATENT DOCUMENTS

| | | |
|---|---|---|
| 5,744,864 A | 4/1998 | Cillessen et al. |
| 5,982,471 A | 11/1999 | Hirakata et al. |
| 6,169,532 B1 | 1/2001 | Sumi et al. |
| 6,266,038 B1 | 7/2001 | Yoshida et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,961,042 B2 | 11/2005 | Murai |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,098,880 B2 | 8/2006 | Inoue et al. |
| 7,099,174 B2 * | 8/2006 | Thompson et al. ... G11C 5/025 257/208 |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,517 B2 | 6/2010 | Kawamura et al. |
| 8,000,126 B2 | 8/2011 | Morikawa et al. |
| 8,067,775 B2 | 11/2011 | Miyairi et al. |
| 8,378,403 B2 | 2/2013 | Kato |
| 8,421,081 B2 | 4/2013 | Kato et al. |
| 8,455,868 B2 | 6/2013 | Yamazaki et al. |
| 8,686,486 B2 | 4/2014 | Kato et al. |
| 8,687,411 B2 | 4/2014 | Saito |
| 8,709,889 B2 | 4/2014 | Saito |
| 8,743,590 B2 | 6/2014 | Kurokawa |
| 8,772,849 B2 | 7/2014 | Noda |
| 8,787,102 B2 | 7/2014 | Ishizu |
| 8,797,785 B2 | 8/2014 | Saito |
| 8,809,853 B2 | 8/2014 | Saito et al. |
| 8,809,927 B2 | 8/2014 | Takemura |
| 8,854,865 B2 | 10/2014 | Saito |
| 8,896,046 B2 | 11/2014 | Kato |
| 8,958,263 B2 | 2/2015 | Takemura |
| 9,478,276 B2 * | 10/2016 | Onuki .................. G11C 7/1069 |
| 2001/0020928 A1 | 9/2001 | Yanagisawa et al. |
| 2001/0046027 A1 | 11/2001 | Tai et al. |
| 2002/0003271 A1 | 1/2002 | Ikeda et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0219188 A1 | 10/2005 | Kawabe et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0205976 A1 | 9/2007 | Takatori et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042968 A1 | 2/2008 | Oh |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284970 A1 | 11/2008 | Ishitani |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0079684 A1 | 3/2009 | Watanabe |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0195431 A1 | 8/2010 | Ohgami |
| 2010/0244020 A1 | 9/2010 | Sakata et al. |
| 2011/0199807 A1 | 8/2011 | Saito et al. |
| 2012/0061668 A1 | 3/2012 | Miyairi et al. |
| 2012/0161220 A1 | 6/2012 | Yamazaki |

(56) References Cited

U.S. PATENT DOCUMENTS

| | | |
|---|---|---|
| 2012/0193697 A1 | 8/2012 | Takemura |
| 2013/0069132 A1 | 3/2013 | Atsumi et al. |
| 2013/0140569 A1 | 6/2013 | Yoneda et al. |
| 2013/0148411 A1 | 6/2013 | Atsumi et al. |
| 2013/0155790 A1 | 6/2013 | Atsumi |
| 2013/0221356 A1 | 8/2013 | Yamazaki et al. |
| 2013/0258746 A1 | 10/2013 | Kurokawa |
| 2014/0325249 A1 | 10/2014 | Toyotaka |
| 2014/0374747 A1 | 12/2014 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-013536 A | 1/2006 |
| JP | 2011-151383 A | 8/2011 |
| JP | 2012-178555 A | 9/2012 |
| JP | 2013-145875 A | 7/2013 |
| KR | 2012-0089588 A | 8/2012 |
| TW | 201234535 | 8/2012 |
| WO | WO-2004/114391 | 12/2004 |

OTHER PUBLICATIONS

Written Opinion (Application No. PCT/IB2015/052387) dated Jun. 2, 2015.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, PP. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 2452002-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEARLD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

MEMORY DEVICE AND SEMICONDUCTOR DEVICE

CROSS-REFERENCE TO RELATED APPLICATIONS

This application is a continuation of U.S. application Ser. No. 14/679,111, filed Apr. 6, 2015, now allowed, which claims the benefit of foreign priority applications filed in Japan as Serial No. 2014-080872 on Apr. 10, 2014, Serial No. 2014-092831 on Apr. 28, 2014, and Serial No. 2014-180022 on Sep. 4, 2014, all of which are incorporated by reference.

TECHNICAL FIELD

One embodiment of the present invention relates to memory devices and semiconductor devices including the memory devices.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power memory device, a memory device, a method for driving any of them, and a method for manufacturing any of them.

BACKGROUND ART

A dynamic random access memory (DRAM) stores data by supply of electric charge to a capacitor. Thus, the off-state current of a transistor for controlling the supply of electric charge to the capacitor is preferably small. This is because off-state current can increase the data holding period, and the frequency of refresh operation can be reduced. Patent Document 1 describes a semiconductor device which can hold stored content for a long time by using a transistor including an oxide semiconductor film and having a low off-state current.

REFERENCE

Patent Document

[Patent Document 1] Japanese Published Patent Application No. 2011-151383

DISCLOSURE OF INVENTION

DRAM is advantageous for large memory capacitance as compared to other memory devices; however, the memory capacitance per unit area needs to be increased as in other memory devices in order that an LSI having a higher degree of integration is realized while an increase in a chip size is suppressed.

In view of the technical background, an object of one embodiment of the present invention is to provide a memory device in which the layout area is reduced and the memory capacitance per unit area is increased. Another object of one embodiment of the present invention is to achieve a downsized semiconductor device.

An object of one embodiment of the present invention is to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems

A memory device of one embodiment of the present invention includes a sense amplifier electrically connected to a first wiring and a second wiring and positioned in a first layer, and a first circuit and a second circuit positioned in a second layer over the first layer. The first circuit includes a first switch being turned on and off in accordance with a potential of a third wiring, and a first capacitor electrically connected to the first wiring via the first switch. The second circuit includes a second switch being turned on and off in accordance with a potential of a fourth wiring, and a second capacitor electrically connected to the second wiring via the second switch. The first wiring intersects the third wiring and does not intersect the fourth wiring in the second layer. The second wiring intersects the fourth wiring and does not intersect the third wiring in the second layer.

In the memory device of one embodiment of the present invention, the first switch or the second switch includes a transistor. The transistor may include an oxide semiconductor film, and a channel formation region of the transistor may be included in the oxide semiconductor film.

In the memory device of one embodiment of the present invention, the oxide semiconductor film may contain In, Ga, and Zn.

A semiconductor device of one embodiment may include the memory device and a logic circuit.

According to one embodiment of the present invention, a memory device with a reduced layout area and memory capacitance per unit area is increased or a downsized semiconductor device can be provided.

One embodiment of the present invention can provide a novel semiconductor device or the like. Note that the description of these effects does not disturb the existence of other effects. One embodiment of the present invention does not necessarily achieve all the objects listed above. Other effects will be apparent from and can be derived from the description of the specification, the drawings, the claims, and the like.

BEST MODE FOR CARRYING OUT THE INVENTION

Figure 1:
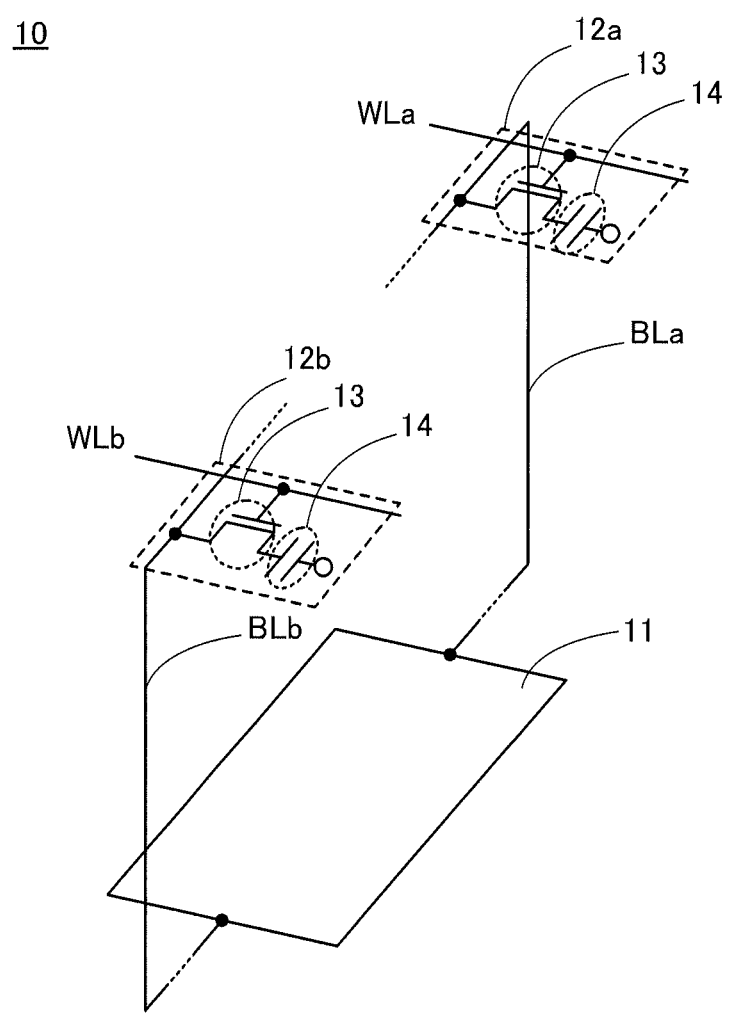
FIG. 1 illustrates a structure of a memory device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that a semiconductor device of one embodiment of the present invention includes, in its category, a variety of semiconductor integrated circuits including memory devices, such as microprocessors, image processing circuits, controllers for semiconductor display devices, digital signal processors (DSP), microcontrollers, control circuits for batteries such as secondary batteries, and protection circuits. A semiconductor device of one embodiment of the present invention includes, in its category, various devices such as RF tags formed using any of the above semiconductor integrated circuits and semiconductor display devices. A semiconductor display device includes the following in its category: liquid crystal display devices, light-emitting devices in which a light-emitting element typified by an organic light-emitting element is provided for each pixel, electronic paper, digital micromirror devices (DMD), plasma display panels (PDP), field emission displays (FED), and other semiconductor display devices in which a memory device is included in a driver circuit.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the conductivity type of the transistor or levels of potentials applied to terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Even when different components are connected to each other in a circuit diagram, there is actually a case where one conductive film has functions of a plurality of components such as a case where part of a wiring serves as an electrode. The term "connection" also means such a case where one conductive film has functions of a plurality of components.

(Structure Example of Memory Device)

FIG. 1 illustrates a structure example of a memory device according to one embodiment of the present invention. A memory device 10 shown in FIG. 1 includes a sense amplifier 11 and a memory cell 12a and a memory cell 12b which are electrically connected to the sense amplifier 11. In one embodiment of the present invention, the sense amplifier 11 is positioned in a first layer, and the memory cells 12a and 12b are positioned in a second layer over the first layer.

Compared to the case where the sense amplifier 11 and the memory cells 12a and 12b are provided in one layer, in the case where at least part of the memory cells 12a and 12b in the second layer overlaps with the sense amplifier 11 in the first layer, layout area of the memory device 10 can be reduced and memory capacitance per unit area can be increased.

The sense amplifier 11 amplifies potential difference between a reference potential and the potential of a data-containing signal output from the memory cell 12a or 12b, and holds the amplified potential difference. Specifically, the potential of the data-containing signal output from the memory cell 12a is supplied to the sense amplifier 11 via a wiring BLa. Similarly, the potential of the data-containing signal output from the memory cell 12b is supplied to the sense amplifier 11 via a wiring BLb.

Each of the memory cells 12a and 12b includes a switching transistor 13 and a capacitor 14. Specifically, the transistor 13 in the memory cell 12a is turned on and off in accordance with the potential of the wiring WLa connected to a gate of the transistor 13. In addition, the capacitor 14 is electrically connected to the wiring BLa via the transistor 13. Similarly, the transistor 13 in the memory cell 12b is turned on and off in accordance with the potential of the wiring WLb connected to a gate of the transistor 13. In addition, the capacitor 14 is electrically connected to the wiring BLb via the transistor 13.

FIG. 1 shows an example in which one wiring BLa is electrically connected to one memory cell 12a and one wiring BLb is electrically connected to one memory cell 12b. Note that in the memory device 10 of one embodiment of the present invention, one wiring BLa may be electrically connected a plurality of memory cells 12a and one wiring BLb may be electrically connected to a plurality of memory cells 12b, As for the layout of the memory cells 12a and 12b included in the memory device 10, a folded type, an open type, or the like can be used. In the case of the folded type, the influence of potential change of the wiring WLa or WLb on the potential of the data-containing signal output from the wiring BLa or BLb can be prevented. In the case of the open type, the memory cells 12a and 12b can be laid out with higher density than in the folded type, so that the whole cell array including the memory cells 12a and 12b can be small.

FIG. 1 shows a structure example of the memory device 10 including the open type memory cells 12a and 12b. Specifically, in the second layer in the memory device 10 shown in FIG. 1, the wiring BLa intersects the wiring WLa and does not intersect the wiring WLb, and the wiring BLb intersects the wiring WLb and does not intersect the wiring WLa.

The area where a plurality of memory cells 12a and a plurality of memory cells 12b are formed in the open type in one embodiment of the present invention can be smaller than that in the folded type. Thus, even when a plurality of sense amplifiers 11 are closely arranged in the first layer, a plurality of memory cells 12a and 12b corresponding to the respective sense amplifiers 11 can be arranged in the second layer without invading the other memory cell's area. Since one embodiment of the present invention employs the open type, the layout are of the memory device 10 is reduced and memory capacitance per unit area can be increased.

In addition, because the memory cells 12a and 12b and the sense amplifier 11 are stacked, the length of the wirings electrically connecting the memory cells 12a and 12b to the sense amplifier 11, such as the wirings BLa, BLb, and the like, can be reduced. The resistance of the wirings can be made small, so that reduction in power consumption and high-speed operation are achieved in the memory device 10.

Figure 2:
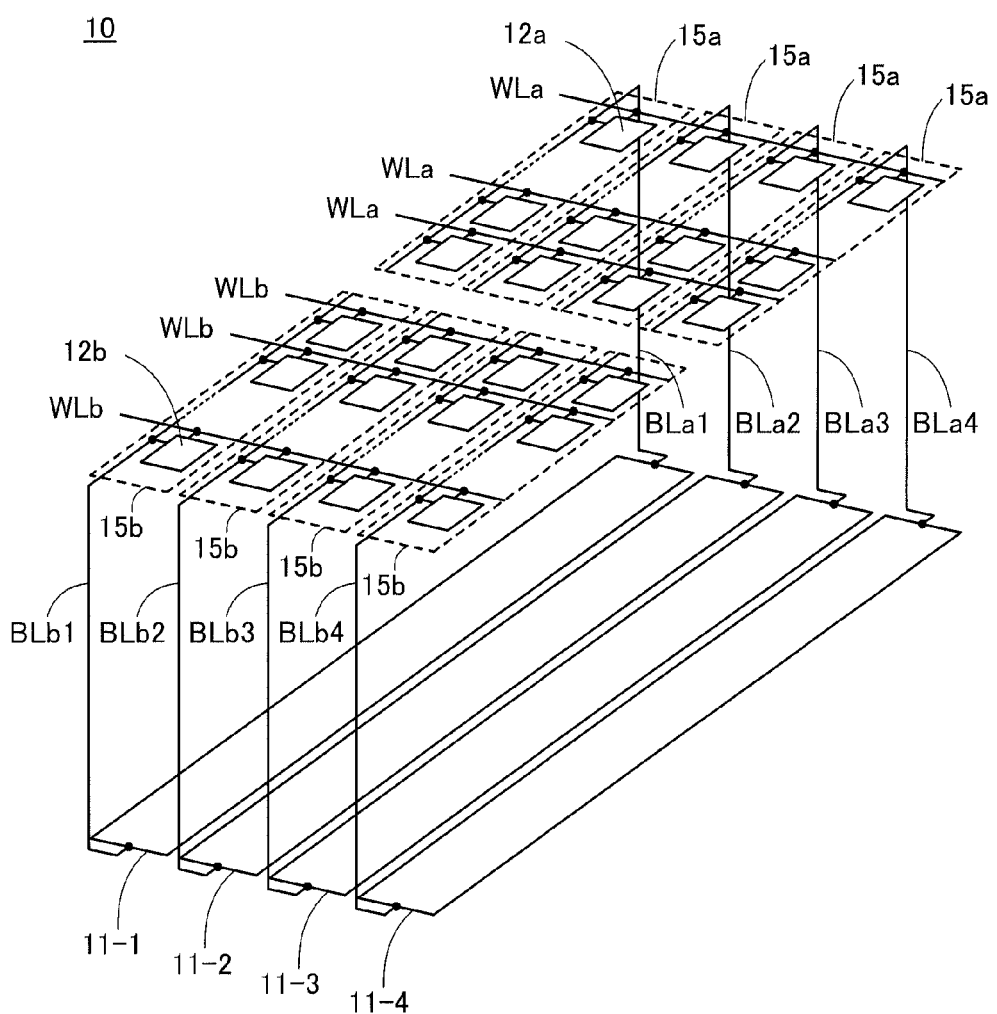
FIG. 2 illustrates a structure of a memory device.
Figure 3:
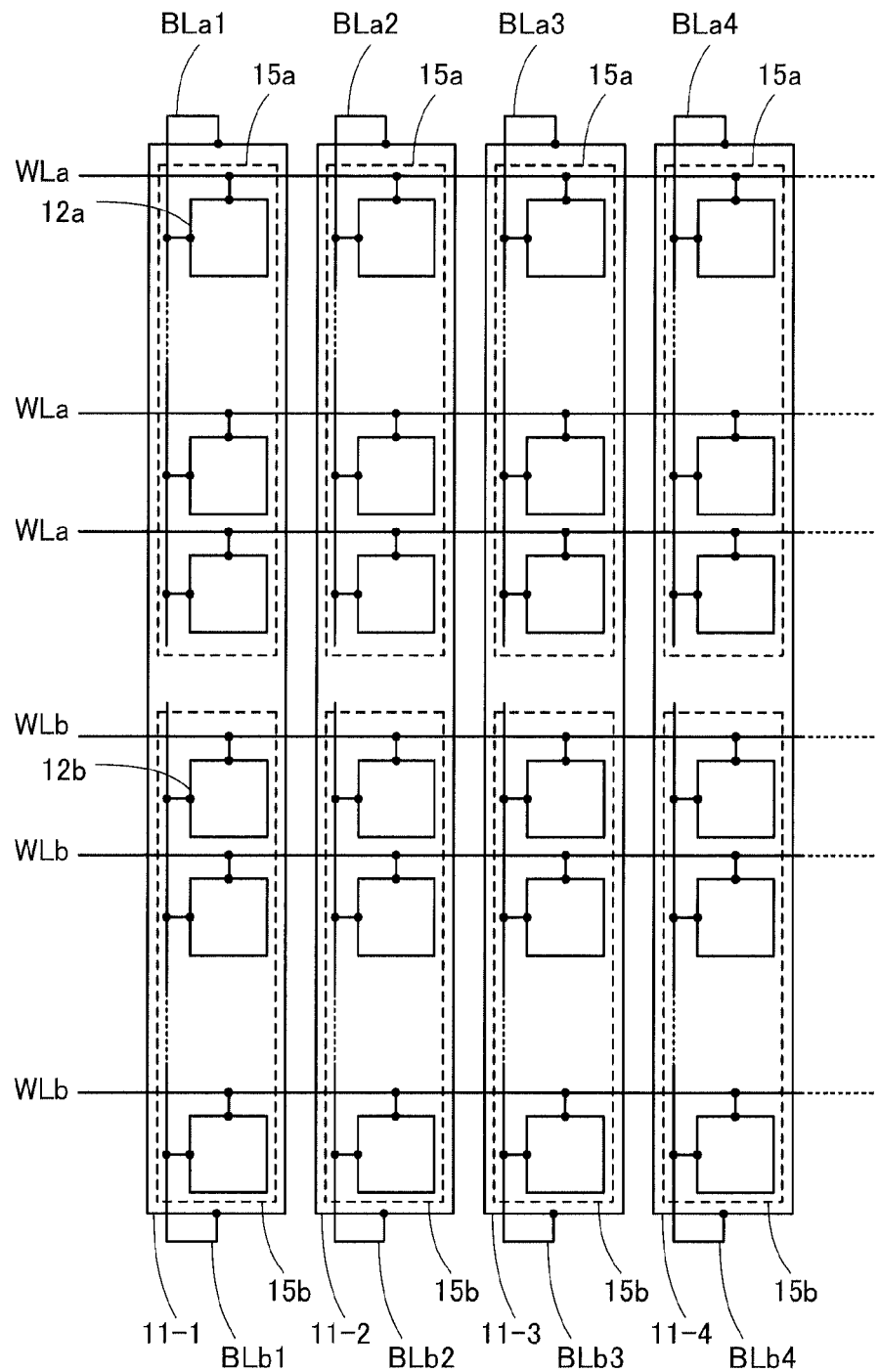
FIG. 3 illustrates a structure of a memory device.

Note that the memory cells 12a and 12b may overlap one sense amplifier 11 or different sense amplifiers 11 from each other, FIG. 2 shows a structure example of an open-type memory device 10 in which the memory cells 12a and 12b electrically connected to one sense amplifier 11 overlap the sense amplifier 11. FIG. 3 is a top view of the memory device 10 in FIG. 2.

The memory device 10 in FIG. 2 and FIG. 3 includes four sets of one sense amplifier 11 in the first layer and a plurality of memory cells 12a and a plurality of memory cells 12b which are electrically connected to the sense amplifier 11. The four sense amplifiers 11 are represented by sense amplifiers 11-1, 11-2, 11-3, and 11-4 in FIG. 2 and FIG. 3. Note that the number of sets included in the memory device 10 of one embodiment of the present invention may be one, two, three, or more than four.

In FIG. 2 and FIG. 3, a region 15a including the plurality of memory cells 12a and a region 15b including the plurality of memory cells 12b overlap the sense amplifier 11 electrically connected the plurality of memory cells 12a and 12b.

Note that in FIG. 2 and FIG. 3, the sense amplifiers 11-1, 11-2, 11-3, and 11-4 are electrically connected to wirings BLa1, BLa2, BLa3, and BLa4, respectively, and to wirings BLb1, BLb2, BLb3, and BLb4, respectively. The plurality of memory cells 12a in the region 15a is electrically connected to one wiring BLa represented by BLa1 to BLa4. The plurality of memory cells 12b in the region 15b is electrically connected to one of the wirings BLb represented by BLb1 to BLb4.

The four regions 15a including the memory cells 12a electrically connected different sense amplifiers 11-1 to 11-4 from each other share a plurality of wirings WLa. Specifically, one wiring WLa is electrically connected to four memory cells 12a in the respective regions 15a which are electrically connected to different wirings BLa1 to BLa4 from each other. Similarly, the four regions 15b including the memory cells 12b electrically connected different sense amplifiers 11-1 to 11-4 from each other share a plurality of wirings WLb. Specifically, one wiring WLb is electrically connected to four memory cells 12b which are electrically connected to different wirings BLb1 to BLb4 from each other.

In the open-type memory device 10 shown in FIG. 2 and FIG. 3, each wiring BLa intersects the wirings WLa and does not intersect the wirings WLb in the second layer. Similarly, each wiring BLb intersects the wirings WLb in the second layer and does not intersect the wirings WLa.

The layout area of the memory device 10 shown in FIG. 2 and FIG. 3 can be reduced and memory capacitance per unit area can be increased owing to this structure.

Figure 4:
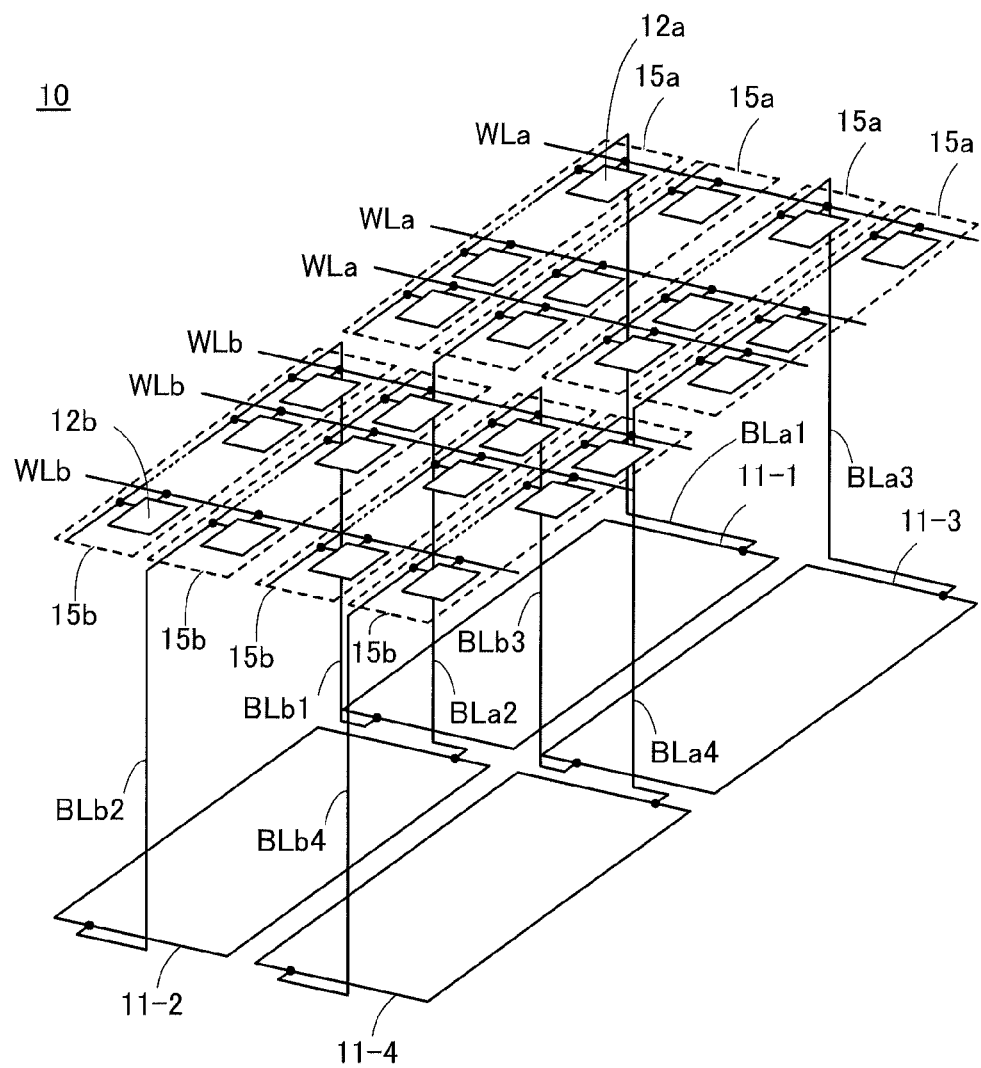
FIG. 4 illustrates a structure of a memory device.
Figure 5:
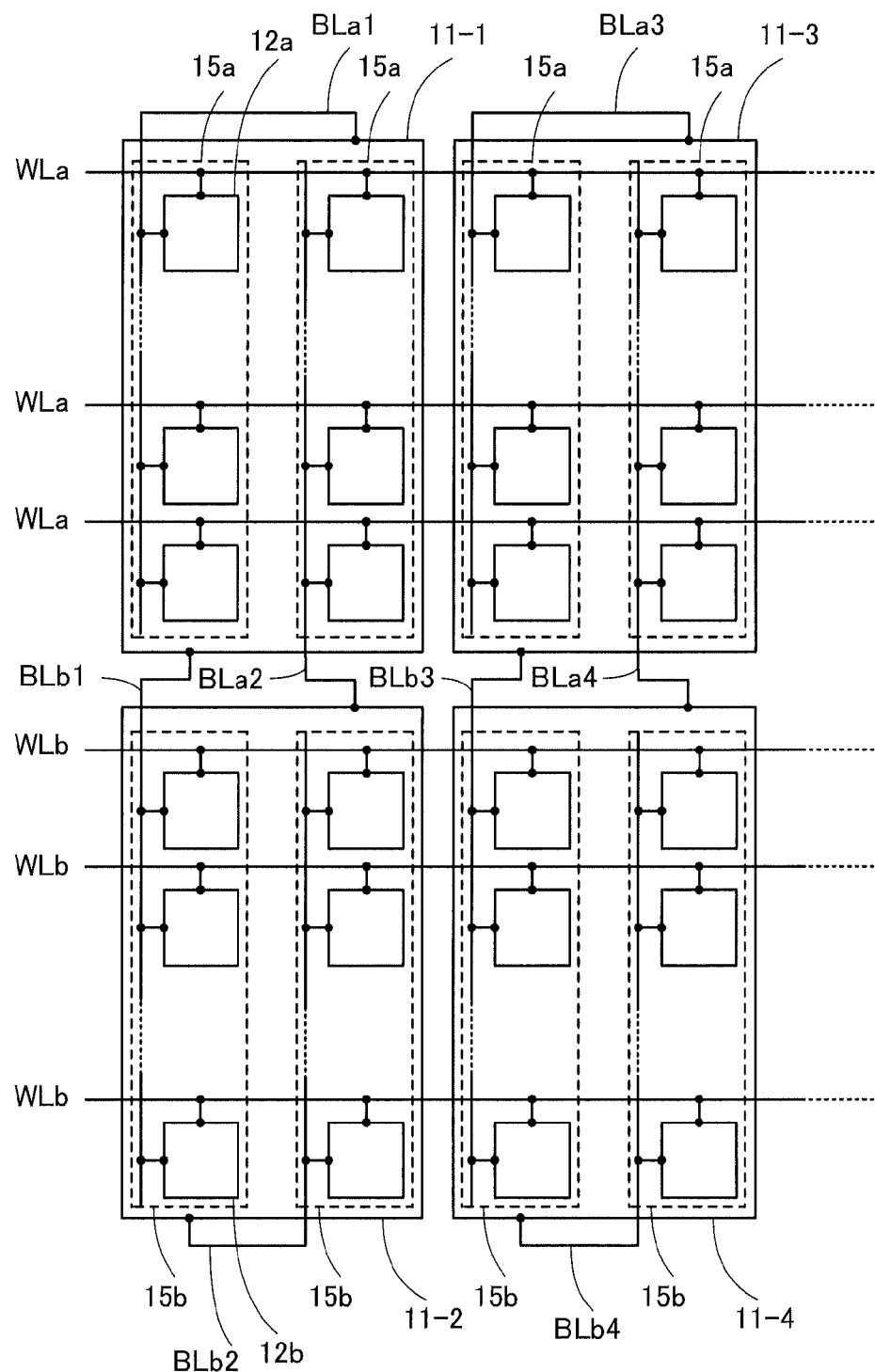
FIG. 5 illustrates a structure of a memory device.

FIG. 4 shows a structure example of an open-type memory device 10. In this memory device 10, the memory cells 12a are electrically connected to two different sense amplifiers 11 and overlap one of the sense amplifiers 11, and the memory cells 12b are electrically connected to the two sense amplifiers 11 and overlap the other of the sense amplifiers 11. FIG. 5 is a top view of the memory device 10 shown in FIG. 4.

The memory device 10 in FIG. 4 and FIG. 5 includes four sets of one sense amplifier 11 in the first layer and a plurality of memory cells 12a and a plurality of memory cells 12b which are electrically connected to the sense amplifier 11. The four sense amplifiers 11 are represented by the sense amplifiers 11-1, 11-2, 11-3, and 11-4 also in FIG. 4 and FIG. 5. Note that the number of sets in the memory device 10 of one embodiment of the present invention may be two, three, or more than four.

In FIG. 4 and FIG. 5, memory cells 12a electrically connected to the sense amplifier 11-1 and memory cells 12a electrically connected to the sense amplifier 11-2 overlap the sense amplifier 11-1. Memory cells 12b electrically connected to the sense amplifier 11-1 and memory cells 12b electrically connected to the sense amplifier 11-2 overlap the sense amplifier 11-2. Memory cells 12a electrically connected to the sense amplifier 11-3 and memory cells 12a electrically connected to the sense amplifier 11-4 overlap the sense amplifier 11-3. Memory cells 12b electrically connected to the sense amplifier 11-3 and memory cells 12b electrically connected to the sense amplifier 11-4 overlap the sense amplifier 11-4.

Note that in FIG. 4 and FIG. 5, the sense amplifiers 11-1 to 11-4 are electrically connected to the wirings BLa1 to BLa4, respectively, and to BLb1 to BLb4, respectively. The plurality of memory cells 12a in one region 15a is electrically connected to one wiring BLa represented by BLa1 to BLa4. The plurality of memory cells 12b in one region 15b is electrically connected to one wiring BLb represented by BLb1 to BLb4.

In the memory device 10 in FIG. 4 and FIG. 5, the four regions 15a including the memory cells 12a electrically connected different sense amplifiers 11-1 to 11-4 from each other share a plurality of wirings WLa. The four regions 15b including the memory cells 12b electrically connected different sense amplifiers 11-1 to 11-4 from each other share a plurality of wirings WLb.

Specifically, in the four regions 15a including the memory cells 12a electrically connected to different sense amplifiers 11-1 to 11-4 from each other, one wiring WLa is electrically connected to four memory cells 12a electrically connected to different wirings BLa1 to BLa4 from each other. In the four regions 15b including the memory cells 12b electrically connected to different sense amplifiers 11-1 to 11-4 from each other, one wiring WLb is electrically connected to four memory cells 12b electrically connected to different wirings BLb1 to BLb4 from each other.

In the open-type memory device 10 shown in FIG. 4 and FIG. 5, an arbitrary wiring BLa intersects the wirings WLa and does not intersect the wirings WLb in the second layer. Similarly, one wiring BLb intersects the wirings WLb and does not intersect the wirings WLa in the second layer.

The layout area of the memory device 10 shown in FIG. 4 and FIG. 5 can be reduced and memory capacitance per unit area can be increased owing to this structure.

<Specific Structure Example of Memory Device>

Next, an example of a specific structure of the memory device 10 according to one embodiment of the present invention will be described.

Figure 6:
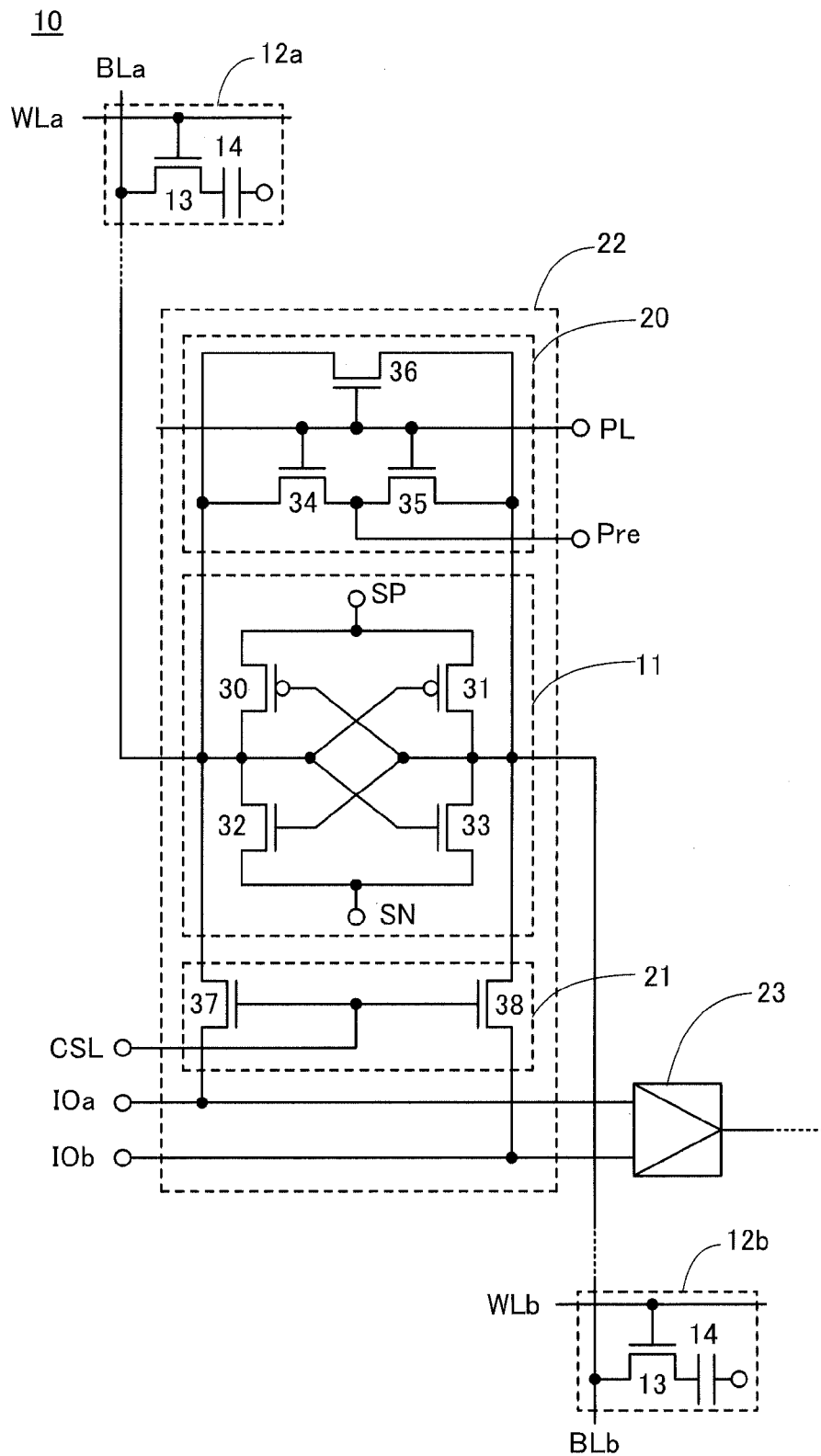
FIG. 6 illustrates a connection structure of a memory cell, a sense amplifier, a precharge circuit, a switch circuit, and a main amplifier.

FIG. 6 shows a connection example of the memory cells 12a and 12b, the sense amplifier 11 electrically connected to the memory cells 12a and 12b, a precharge circuit 20, a switch circuit 21, and a main amplifier 23.

The precharge circuit 20 has a function of initializing potentials of the wirings BLa and BLb. The switch circuit 21 has a function of switching the conduction between the wirings BLa and BLb and the main amplifier 23. In this embodiment, in addition to the sense amplifier 11, the precharge circuit 20 or the switch circuit 21 can also be provided in the first layer so as to overlap with the memory cells 12a and 12b. Hereinafter, the sense amplifier 11, the precharge circuit 20, and the switch circuit 21 are collectively referred to as a driver circuit 22.

The memory cell 12a is electrically connected to the driver circuit 22 via the wiring BLa. The memory cell 12b is electrically connected to the driver circuit 22 via the wiring BLb.

Although one memory cell 12a is electrically connected to the driver circuit 22 via one wiring BLa in FIG. 6, a plurality of memory cells 12a may be electrically connected to the driver circuit 22 via one wiring BLa. Although one memory cell 12b is electrically connected to the driver circuit 22 via one wiring BLb in FIG. 6, a plurality of memory cells 12b may be electrically connected to the driver circuit 22 via one wiring BLb. Note that the memory cells 12a connected to the same wiring BLa are electrically connected to different wirings WLa from each other, and the memory cells 12b connected to the same wiring BLb is electrically connected to different wirings WLb from each other.

The sense amplifier 11 in FIG. 6 is a latch sense amplifier. Specifically, the sense amplifier 11 in FIG. 6 includes p-channel transistors 30 and 31 and n-channel transistors 32 and 33. One of a source and a drain of the transistor 30 is electrically connected to a wiring SP and the other is electrically connected to gates of the transistors 31 and 33 and the wiring BLa. One of a source and a drain of the transistor 32 is electrically connected to the gates of the transistors 31 and 33 and the wiring BLa and the other is electrically connected to a wiring SN. One of a source and a drain of the transistor 31 is electrically connected to the wiring SP and the other is electrically connected to gates of the transistors 30 and 32 and the wiring BLb. One of a source and a drain of the transistor 33 is electrically connected to the gates of the transistors 30 and 32 and the wiring BLb and the other is electrically connected to the wiring SN.

The precharge circuit 20 includes n-channel transistors 34 to 36. The transistors 34 to 36 may be p-channel transistors. One of a source and a drain of the transistor 34 is electrically connected to the wiring BLa and the other is electrically connected to a wiring Pre. One of a source and a drain of the transistor 35 is electrically connected to the wiring BLb and the other is electrically connected to the wiring Pre. One of a source and a drain of the transistor 36 is electrically connected to the wiring BLa and the other is electrically connected to the wiring BLb. Gates of the transistors 34 to 36 are electrically connected to a wiring PL.

The switch circuit 21 includes n-channel transistors 37 and 38. The transistors 37 and 38 may be p-channel transistors. One of a source and a drain of the transistor 37 is electrically connected to the wiring BLa and the other is electrically connected to a wiring IOa. One of a source and a drain of the transistor 38 is electrically connected to the wiring BLb and the other is electrically connected to a wiring IOb. Gates of the transistors 37 and 38 are electrically connected to a wiring CSL.

The wirings IOa and IOb are electrically connected to the main amplifier 23.

Next, an example of operation for data reading of the memory cells 12a and 12b, the driver circuit 22, and the main amplifier 23 shown in FIG. 6 is described with reference to a timing chart of FIG. 7.

First, in a period T1, the transistors 34 to 36 included in the precharge circuit 20 are turned on to initialize the potentials of the wirings BLa and BLb. Specifically, in FIG. 7, a high-level potential VH_PL is supplied to the wiring PL to turn on the transistors 34 to 36 in the precharge circuit 20. In this manner, a potential Vpre of the wiring Pre is supplied to the wirings BLa and BLb.

Note that in the period T1, a low-level potential VL_CSL is supplied to the wiring CSL, and accordingly, the transistors 37 and 38 in the switch circuit 21 are off. A low-level potential VL_WL is supplied to the wiring WLa, and accordingly, the transistor 13 in the memory cell 12a is off. The low-level potential VL_WL is also supplied to the wiring WLb, and accordingly, the transistor 13 in the memory cell 12b is off (not shown in FIG. 7). The potential Vpre is supplied to the wirings SP and SN, and accordingly, the sense amplifier 11 is off.

Then, a low-level potential VL_PL is supplied to the wiring PL to turn off the transistors 34 to 36 in the precharge circuit 20. In a period T2, the wiring WLa is selected. Specifically, in FIG. 7, a high-level potential VH_WL is supplied to the wiring WLa to select the wiring WLa and turn on the transistor 13 in the memory cell 12a. The wiring BLa and the capacitor 14 are thus electrically connected to each other via the transistor 13. Since the wiring BLa and the capacitor 14 are electrically connected to each other, the potential of the wiring BLa changes in accordance with the amount of charge held in the capacitor 14.

Figure 7:
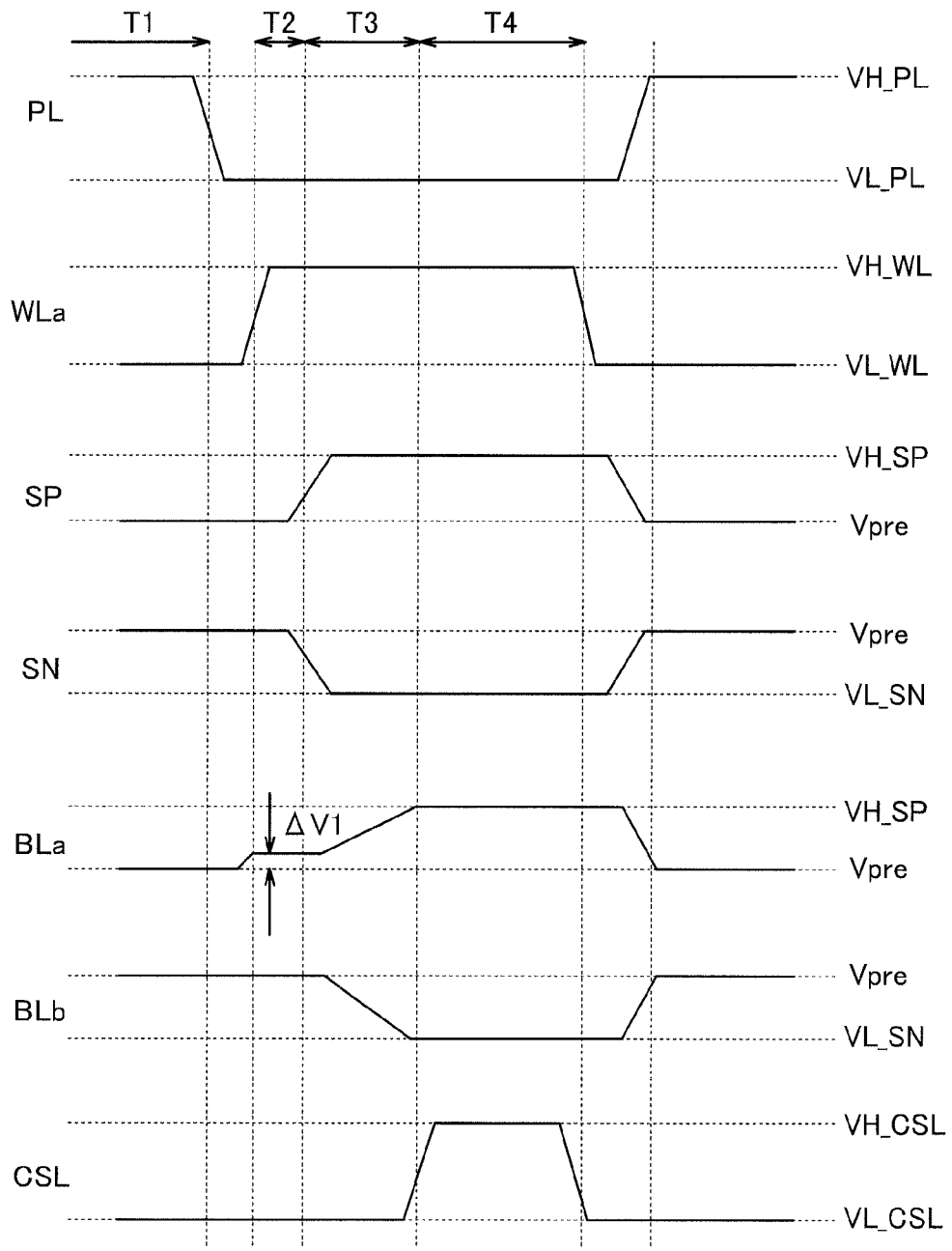
FIG. 7 illustrates a timing chart.

The timing chart in FIG. 7 shows, as an example, the case where the amount of charge accumulated in the capacitor 14 is large. Specifically, in the case where the amount of charge accumulated in the capacitor 14 is large, charge is released from the capacitor 14 to the wiring BLa, so that the potential of the wiring BLa rises from the potential Vpre by ΔV1. In the case where the amount of charge accumulated in the capacitor 14 is small, charge flows from the wiring BLa into the capacitor 14, so that the potential of the wiring BLa falls by ΔV2.

Note that in the period T2, the low-level potential VL_CSL is kept supplied to the wiring CSL, and the transistors 37 and 38 in the switch circuit 21 thus remain off. The potential Vpre is kept supplied to the wirings SP and SN; thus, the sense amplifier 11 remains off.

In a period T3, a high-level potential VH_SP is supplied to the wiring SP and a low-level potential VL_SN is supplied to the wiring SN to turn on the sense amplifier 11. The sense amplifier 11 has a function of amplifying the potential difference between the wirings BLa and BLb (ΔV1 in FIG. 7). Accordingly, in the timing chart in FIG. 7, the sense amplifier 11 is turned on, whereby the potential of the wiring BLa rises from the potential Vpre+ΔV1 to approach the potential VH_SP of the wiring SP. The potential of the wiring BLb falls from the potential Vpre to approach the potential VL_SN of the wiring SN.

Note that in the case where the potential of the wiring BLa is Vpre−ΔV2 at the beginning of the period T3, the sense amplifier 11 is turned on, whereby the potential of the wiring BLa falls from the potential Vpre−ΔV2 to approach the potential VL_SN of the wiring SN. The potential of the wiring BLb rises from the potential Vpre to approach the potential VH_SP of the wiring SP.

In the period T3, the low-level potential VL_PL is kept supplied to the wiring PL to keep the transistors 34 to 36 in the precharge circuit 20 off. The low-level potential VL_CSL is kept supplied to the wiring CSL, thereby keeping the transistors 37 and 38 in the switch circuit 21 off. The high-level potential VH_WL is kept supplied to the wiring WLa; thus, the transistor 13 in the memory cell 12a remains on. Consequently, charge corresponding to the potential VH_SP of the wiring BLa is accumulated in the capacitor 14 in the memory cell 12a.

Next, in a period T4, the potential supplied to the wiring CSL is changed to turn on the switch circuit 21. Specifically, in FIG. 7, a high-level potential VH_CSL is supplied to the wiring CSL, so that the transistors 37 and 38 in the switch circuit 21 are turned on. In this manner, the potential of the wiring BLa and the potential of the wiring BLb are supplied to the main amplifier 23 through the wirings IOa and IOb. The level of a potential Vout which is output from the main amplifier 23 depends on whether the potential of the wiring IOa is higher than that of the wiring IOb. For this reason, a signal containing the potential Vout reflects data read out from the memory cell 12a.

Note that in the period T4, the low-level potential VL_PL is kept supplied to the wiring PL, so that the transistors 34 to 36 in the precharge circuit 20 remain off. The high-level potential VH_WL is also kept supplied to the wiring WLa; thus, the transistor 13 in the memory cell 12a remains on. The high-level potential VH_SP is kept supplied to the wiring SP and the low-level potential VL_SN is kept supplied to the wiring SN; thus, the sense amplifier 11 remains on. As a result, charge corresponding to the potential VH_SP of the wiring BLa is accumulated in the capacitor 14 in the memory cell 12a.

When the period T4 is over, the potential supplied to the wiring CSL is is changed to turn off the switch circuit 21. Specifically, in FIG. 7, the low-level potential VL_CSL is supplied to the wiring CSL, so that the transistors 37 and 38 in the switch circuit 21 are turned off.

Furthermore, when the period T4 is over, the wiring WLa is unselected. Specifically, in FIG. 7, the low potential VL_WL is supplied to the wiring WLa, whereby the wiring WLa is unselected to turn off the transistor 13 in the memory cell 12a. Through the operation, charge corresponding to the potential VH_SP of the wiring BLa is held in the capacitor 14; thus, data is held in the memory cell 12a even after the data is read out.

Through the operation in the periods T1 to T4, data is read from the memory cell 12a. Data in the memory cell 12b can be read similarly.

Note that another data can be written to the memory cell 12a or 12b by operation similar to that for reading data. First, the transistors 34 to 36 included in the precharge circuit 20 are turned on to initialize the potentials of the wirings BLa and BLb. Then, the wiring WLa electrically connected to the memory cell 12a to which data is to be written or the wiring WLb electrically connected to the memory cell 12b to which data is to be written is selected to turn on the transistor 13 in the memory cell 12a or 12b. The wiring BLa or BLb and the capacitor 14 are thereby electrically connected to each other via the transistor 13. Then, the high-level potential VH_SP is supplied to the wiring SP and the low-level potential VL_SN is supplied to the wiring SN to turn on the sense amplifier 11. The potential supplied to the wiring CSL is then changed to turn on the switch circuit 21. Specifically, the high-level potential VH_CSL is supplied to the wiring CSL, so that the transistors 37 and 38 in the switch circuit 21 are turned on. Consequently, the wiring BLa and IOa are electrically connected to each other and the wirings BLb and IOb are electrically connected to each other. The potentials corresponding to data to be written are supplied to the wirings IOa and IOb, thereby supplying the potentials corresponding data to be written to the wirings BLa and BLb via the switch circuit 21. By the operation, charge is accumulated to the capacitor 14 in accordance with the potential of the wiring BLa or BLb and thus the data is written to the memory cell 12a or 12b.

Note that after the potential of the wiring IOa is supplied to the wiring BLa and the potential of the wiring IOb is supplied to the wiring BLb, the relationship in level between the potential of the wiring BLa and the potential of the wiring BLb is maintained by the sense amplifier 11 as long as the sense amplifier 11 is on even after the transistors 37 and 38 in the switch circuit 21 are turned off Therefore, the timing of turning on the transistors 37 and 38 in the switch circuit 21 may be either before or after the selection of the wiring WLa.

Figure 8:
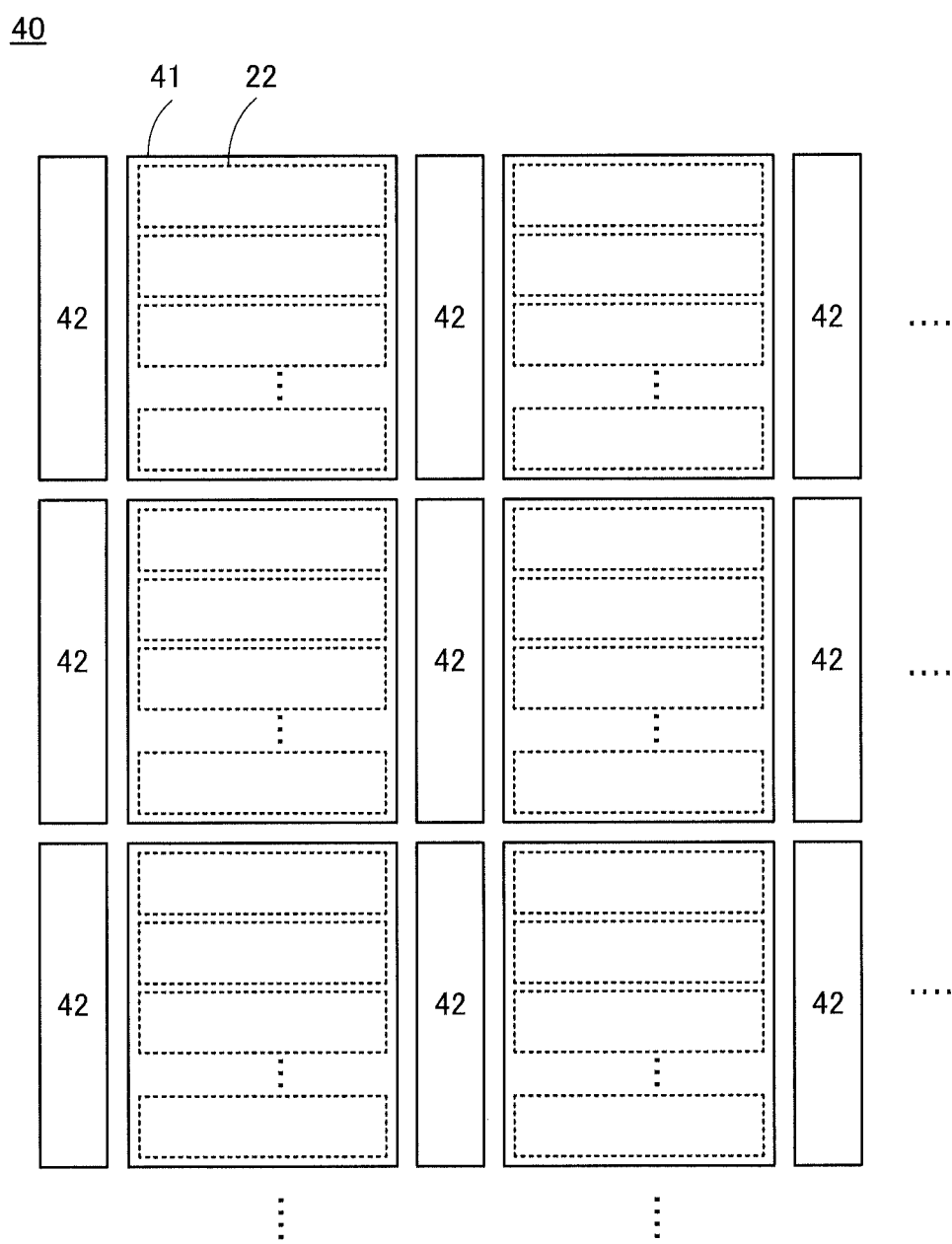
FIG. 8 illustrates a layout of an array.

FIG. 8 shows a layout example of an array 40 including cell arrays 41 each including the memory cells 12a and 12b, the driver circuits 22, and row decoders 42 for controlling potentials of the wirings WLa and WLb. The array 40 is a mode of the memory device of one embodiment of the present invention.

In the array 40 in FIG. 8, the driver circuits 22 in the first layer overlap with the cell arrays 41 in the second layer. The number of memory cells 12a and 12b included in the cell arrays 41 and the number of driver circuits 22 can be determined by a designer.

Figure 9:
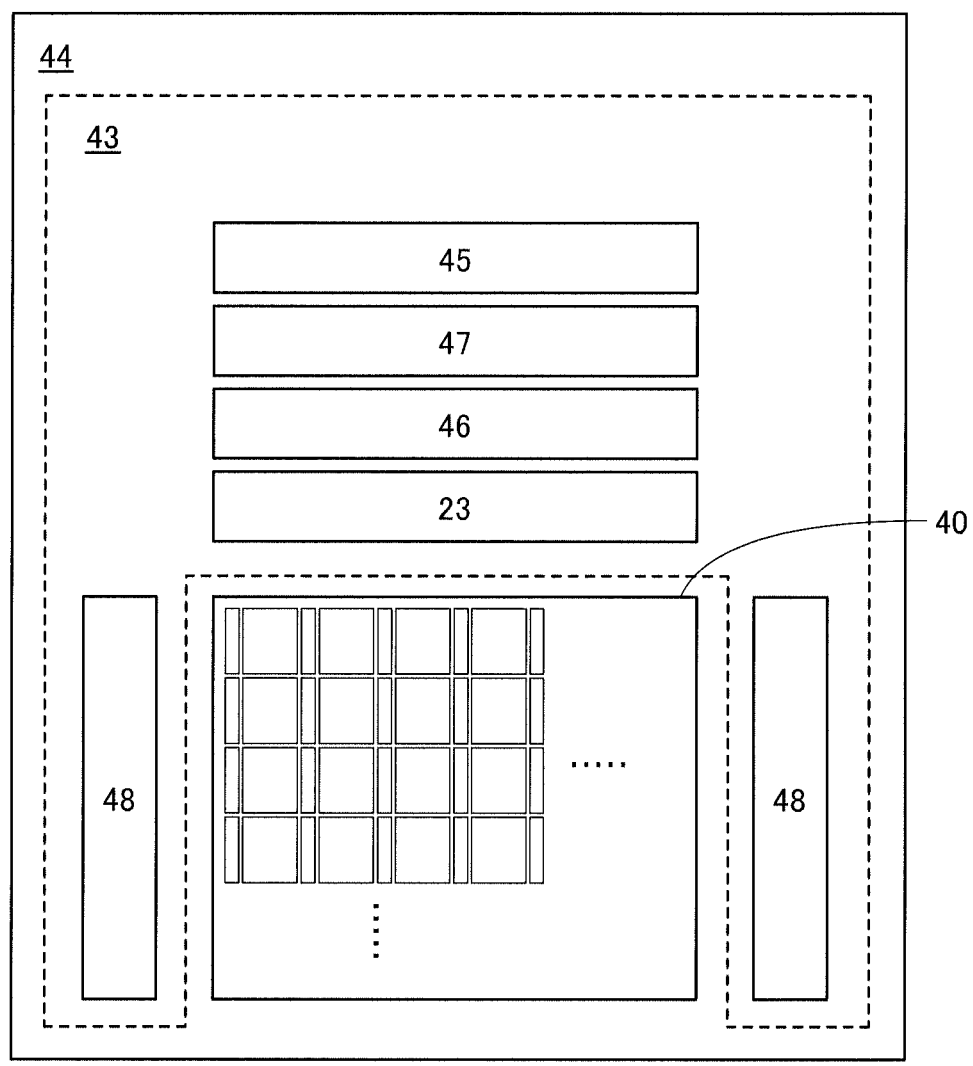
FIG. 9 illustrates a structure of a memory device.

The row decoders 42 are positioned in the first layer or the second layer and control potentials of the wirings WLa and WLb electrically connected to the memory cells 12a and 12b included in the adjacent cell arrays 41, FIG. 9 shows a structure example of a memory device 44 including the array 40 shown in FIG. 8 and a driver circuit 43 for controlling the operation of the array 40. The memory device 44 is a mode of the memory device of one embodiment of the present invention.

Specifically, the driver circuit 43 in the memory device 44 in FIG. 9 includes a buffer 45, a main amplifier 23, a column decoder 46, a write circuit 47, and row decoders 48.

The buffer 45 controls input to the memory device 44 of signals used for driving the driver circuit 43 or the array 40 and data written to the array 40. In addition, the buffer 45 controls output from the memory device 44 of data read out from the array 40.

The row decoders 48 select a row decoder 42 from a plurality of row decoders 42 included in the array 40 in FIG. 8 based on a specified address. The selected row decoder 42 selects the wiring WLa or WLb shown in FIG. 6.

The column decoder 46 has a function of controlling the operation of the switch circuit 21 to select the memory cells 12a and 12b in a column direction at the time of data writing or reading in accordance with the specified address. Specifically, the column decoder 46 in the memory device 10 in FIG. 6 has a function of controlling the potential of the wiring CSL.

The switch circuit 21 has a function of switching the conduction between the wirings BLa and BLb and the main amplifier 23 and the conduction between the wirings BLa and BLb and the write circuit 47. The write circuit 47 has a function of writing data to the memory cell 12a or 12b at the specified address via the switch circuit 21. Specifically, the write circuit 47 in the memory device 10 shown in FIG. 6 has a function of supplying potentials to the wirings IOa and IOb in accordance with data.

The main amplifier 23 has a function of reading out data using the potentials of the wirings BLa and BLb amplified by the sense amplifier 11.

Note that the memory device 44 may include an address buffer that can temporarily store the address of the specified memory cell 12a or 12b.

<Example 1 of Cross-Sectional Structure of Memory Device>

Figure 10:
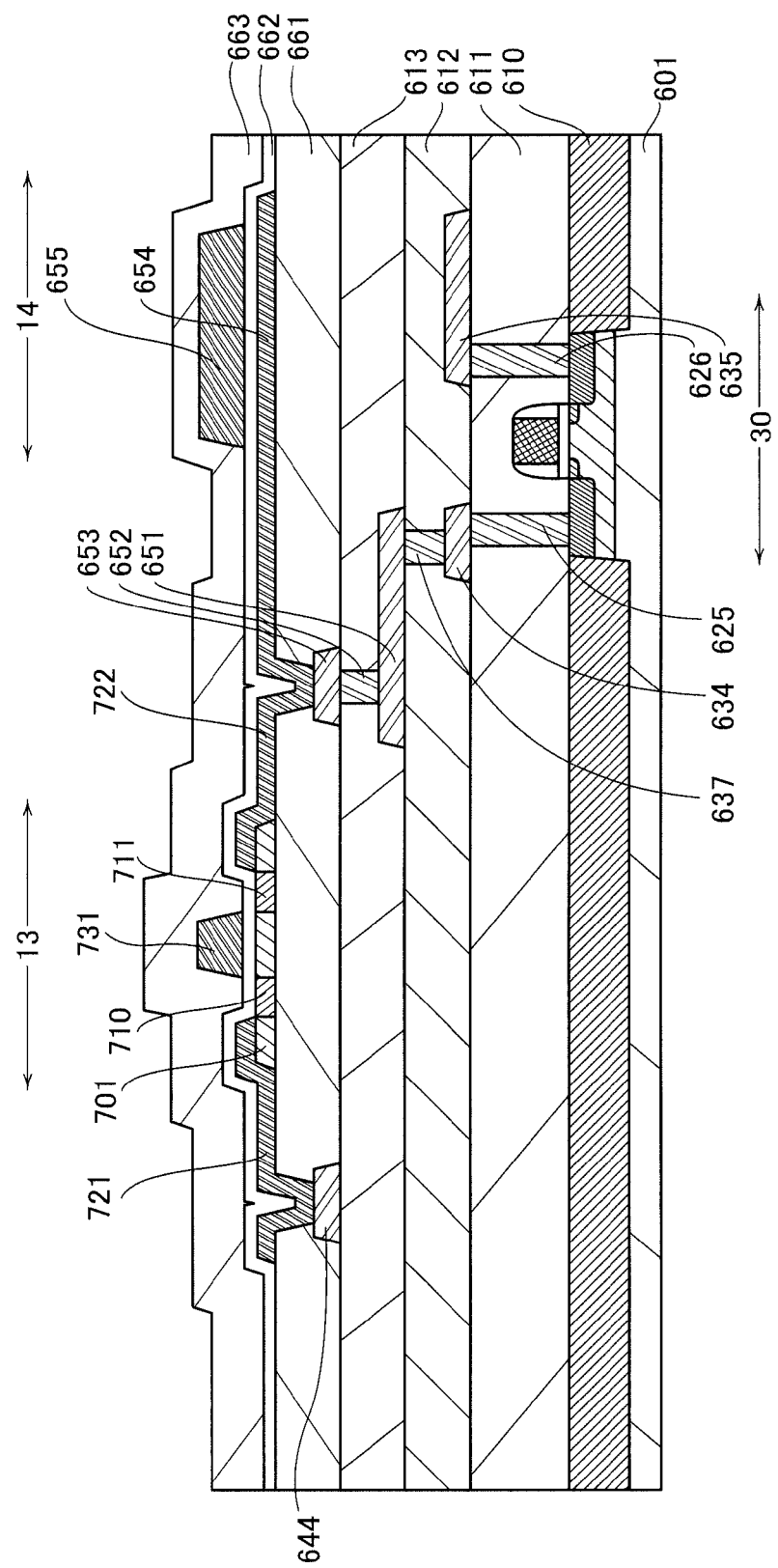
FIG. 10 illustrates a cross-sectional structure of a semiconductor device.

FIG. 10 illustrates an example of a cross-sectional structure of a memory device according to one embodiment of the present invention. Note that FIG. 10 is a cross-sectional view of the transistor 13, the capacitor 14, and the transistor 30 included in the memory device 10 shown in FIG. 6. In FIG. 10 illustrating the cross-sectional structure of the memory device, the transistor 30 including a channel formation region in a single crystal substrate is positioned in the first layer, and the capacitor 14 and the transistor 13 including a channel formation region in an oxide semiconductor film are positioned in the second layer over the first layer.

The transistor 30 may include the channel formation region in a semiconductor film or a semiconductor substrate of silicon, germanium, or the like in an amorphous, microcrystalline, polycrystalline, or single crystal state. In the case where the transistor 30 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 601 where the transistor 30 is formed can be, for example, a silicon substrate, a germanium substrate, or a silicon germanium substrate. In FIG. 10, a single crystal silicon substrate is used as the semiconductor substrate 601.

The transistor 30 is electrically isolated by an element isolation method. As the element isolation method, a selective oxidation method (a local oxidation of silicon (LOCOS) method), a trench isolation method (a shallow trench isolation (STI) method), or the like can be used. FIG. 10 illustrates an example where the trench isolation method is used to electrically isolate the transistor 30. Specifically, in FIG. 10, an element isolation region 610 is formed in such a manner that an insulator including silicon oxide or the like is buried in a trench formed in the semiconductor substrate 601 by etching or the like, so that the transistor 30 is electrically isolated by element isolation.

An insulating film 611 is provided over the transistor 30. Openings are formed in the insulating film 611. Conductive films 625 and 626 that are electrically connected to the source and the drain of the transistor 30 are formed in the openings.

The conductive film 625 is electrically connected to a conductive film 634 formed over the insulating film 611. The conductive film 626 is electrically connected to a conductive film 635 formed over the insulating film 611.

An insulating film 612 is formed over the conductive films 634 to 636. An opening is formed in the insulating film 612. A conductive film 637 electrically connected to the conductive film 636 is formed in the opening. The conductive film 637 is electrically connected to a conductive film 651 formed over the insulating film 612.

An insulating film 613 is formed over the conductive film 651. An opening is formed in the insulating film 613. A conductive film 652 electrically connected to the conductive film 651 is formed in the opening. The conductive film 652 is electrically connected to a conductive film 653 formed over the insulating film 613. A conductive film 644 is formed over the insulating film 613.

An insulating film 661 is formed over the conductive film 653 and the conductive film 644. In FIG. 10, the transistor 13 and the capacitor 14 are formed over the insulating film 661.

The transistor 13 includes, over the insulating film 661, a semiconductor film 701 including an oxide semiconductor, conductive films 721 and 722 functioning as a source and a drain over the semiconductor film 701, a gate insulating film 662 over the semiconductor film 701 and the conductive films 721 and 722, and a gate electrode 731 which is over the gate insulating film 662 and overlaps with the semiconductor film 701 between the conductive films 721 and 722. Note that the conductive films 721 and 722 are electrically connected to the conductive films 644 and 653, respectively in the opening formed in the insulating film 661.

In the semiconductor film 701 of the transistor 13, there is a region 710 between a region overlapping with the conductive film 721 and a region overlapping with the gate electrode 731. In addition, in the semiconductor film 701 of the transistor 13, there is a region 711 between a region overlapping with the conductive film 722 and the region overlapping with the gate electrode 731. When argon, an impurity which imparts p-type conductivity to the semiconductor film 701, or an impurity which imparts n-type conductivity to the semiconductor film 701 is added to the regions 710 and 711 using the conductive films 721 and 722 and the gate electrode 731 as a mask, the resistivity of the regions 710 and 711 can be made lower than that of the region overlapping with the gate electrode 731 in the semiconductor film 701.

The capacitor 14 includes a conductive film 722 over the insulating film 661, the gate insulating film 662 overlapping with the conductive film 722, and a conductive film 655 overlapping with the conductive film 722 with the gate insulating film 662 sandwiched therebetween. The conductive film 655 can be formed together with the gate electrode 731 by forming a conductive film over the gate insulating film 662 and processing the conductive film into a desired shape.

An insulating film 663 is provided over the transistor 13 and the capacitor 14.

In the memory device shown in FIG. 10, the conductive films 634, 637, 651, and 653 which electrically connect the conductive film 722 serving as the source or drain electrode of the transistor 13 with the conductive film 652 serving as the source or drain electrode of the transistor 30 correspond to the wiring BLa. In addition to these conductive films, part of the conductive film 722 or part of the conductive film 625 may be included in the wiring BLa.

In FIG. 10, the transistor 13 has the gate electrode 731 on at least one side of the semiconductor film 701; alternatively, the transistor 13 may have a pair of gate electrodes with the semiconductor film 701 positioned therebetween.

In the case where the transistor 13 has a pair of gate electrodes with the semiconductor film 701 positioned therebetween, one of the gate electrodes may be supplied with a signal for controlling the on/off state, and the other of the gate electrodes may be supplied with a potential from another wiring. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 10, the transistor 13 has a single-gate structure including one channel formation region corresponding to one gate electrode 731. However, the transistor 13 may have a multi-gate structure where a plurality of gate electrodes electrically connected to each other are provided so that a plurality of channel formation regions are included in one active layer.

<Transistor>

Then, structure examples of a transistor 90 in which a channel formation region is formed in an oxide semiconductor film will be described.

Figure 11A:
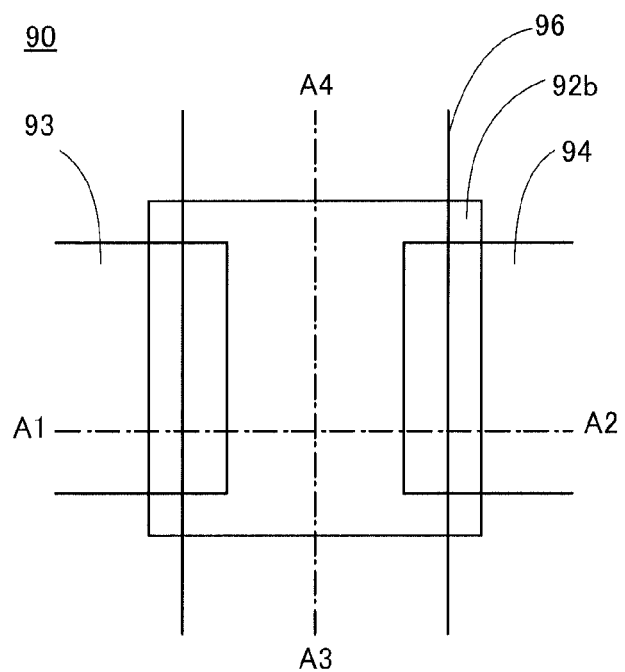
FIGS. 11A to 11C illustrate a structure of a transistor.
Figure 11C:
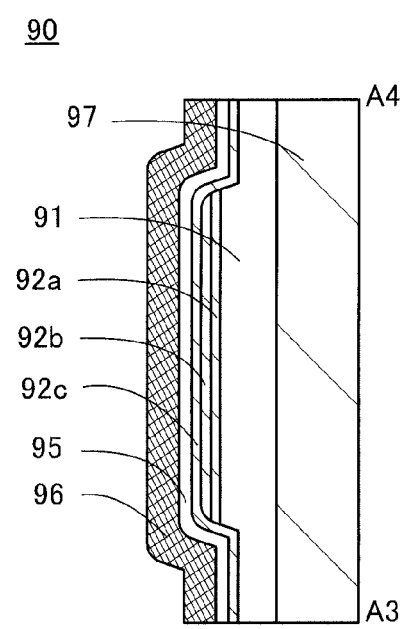
Figure 11B:
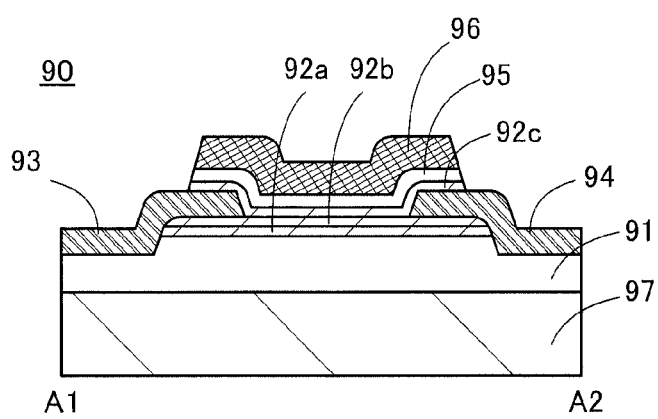

FIGS. 11A to 11C illustrate a structure of the transistor 90 that includes a channel formation region in an oxide semiconductor film as an example. FIG. 11A is a top view of the transistor 90. Note that insulating films are not illustrated in FIG. 11A in order to clarify the layout of the transistor 90. FIG. 11B is a cross-sectional view along dashed-dotted line A1-A2 in the top view in FIG. 11A. FIG. 11C is a cross-sectional view along dashed-dotted line A3-A4 in the top view in FIG. 11A.

As illustrated in FIGS. 11A to 11C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 12A:
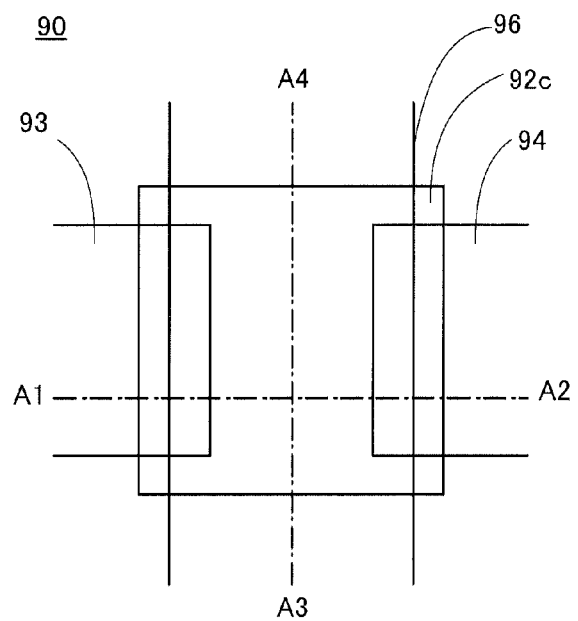
FIGS. 12A to 12C illustrate a structure of a transistor.
Figure 12C:
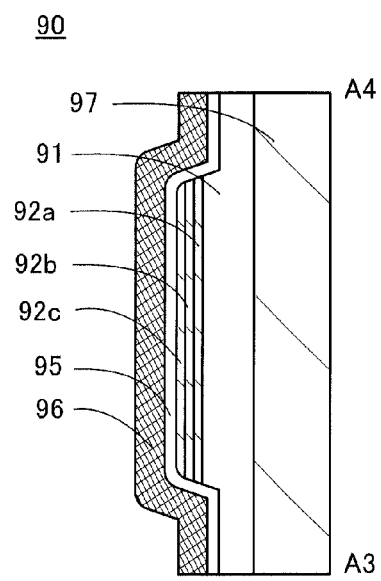
Figure 12B:
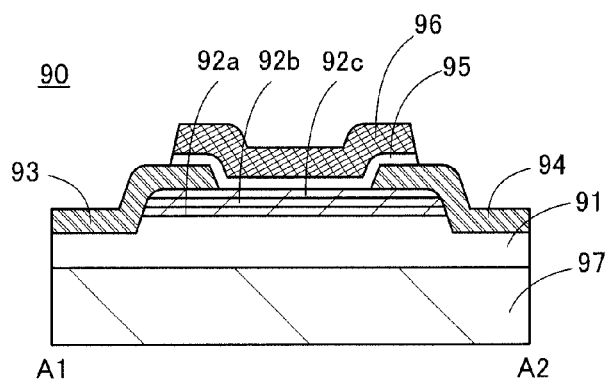

FIGS. 12A to 12C illustrate another specific example of the structure of the transistor 90. FIG. 12A is a top view of the transistor 90. Note that insulating films are not illustrated in FIG. 12A in order to clarify the layout of the transistor 90. FIG. 12B is a cross-sectional view along dashed-dotted line A1-A2 in the top view in FIG. 12A. FIG. 12C is a cross-sectional view along dashed-dotted line A3-A4 in the top view in FIG. 12A.

As illustrated in FIGS. 12A to 12C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 11A to 11C and FIGS. 12A to 12C each illustrate the structure example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the oxide semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films. That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at the interface between the oxide semiconductor films 92b and 92a, a channel region is formed also in a region close to the interface, which varies the threshold voltage of the transistor 90. However, since the oxide semiconductor film 92a contains at least one of metal elements contained in the oxide semiconductor film 92b, an interface state is unlikely to be formed at the interface between the oxide semiconductor films 92b and 92a. Accordingly, the above structure can reduce variations in the electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2/y_2$ is preferably less than $x_1/y_2$ and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, and In:M:Zn=1:3:8.

The oxide semiconductor film 92a and the oxide semiconductor film 92c each have a thickness of more than or equal to 3 nm and less than or equal to 100 nm, preferably more than or equal to 3 nm and less than or equal to 50 nm. The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the oxide semiconductor film 92b is a CAAC-OS film, the oxide semiconductor film 92b is preferably deposited with the use of a polycrystalline target containing In—Ga—Zn oxide (In:Ga:Zn=1:1:1 in an atomic ratio). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Although the oxide semiconductor films 92a to 92c can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has an extremely low off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a low off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-10}$ A, at a voltage (drain voltage) between the source electrode and the drain electrode of from 1 V to 10 V. In that case, it can be seen that the off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charge of the capacitor per unit time. As a result, it was found that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, oxygen vacancies are generated in a region of the oxide semiconductor film that is in contact with the source electrode or the drain electrode, and the region is changed to an n-type region. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material that is easily bonded to oxygen. Examples of such a conductive material include Al, Cr, Cu, Ta, Ti, Mo, and W.

In the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typical spin density at g=2.001 due to a dangling bond of silicon be lower than or equal to $1\times10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma CVD method, a sputtering method, or the like.

Note that in this specification, oxynitride contains more oxygen than nitrogen, and nitride oxide contains more nitrogen than oxygen.

Note that in the transistor 90 illustrated in FIGS. 11A to 11C and FIGS. 12A to 12C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 11A to 11C and FIGS. 12A to 12C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have a low off-state current. Consequently, with the short channel length, the transistor 90 can have a high on-state current when in an on state and a low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

A structure of the oxide semiconductor film is described below.

In this specification, the term "parallel" indicates that the angle formed between two straight lines is greater than or equal to −10° and less than or equal to 10°, and thus also includes greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and thus also includes greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is an oxide semiconductor film having a plurality of c-axis aligned crystal parts.

When a combined analysis image (also referred to as a high-resolution TEM image) of a bright-field image and a diffraction pattern of the CAAC-OS film is observed with a transmission electron microscope (TEM), a plurality of crystal parts are observed clearly. However, even in the high-resolution TEM image, a boundary between crystal parts, that is, a grain boundary is not clearly observed. Thus, in the CAAC-OS film, a reduction in electron mobility due to a grain boundary is less likely to occur.

When the high-resolution cross-sectional TEM image of the CAAC-OS film is observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

When the high-resolution planar TEM image of the CAAC-OS film is observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (or molecular radius), and thus disturbs the atomic arrangement of the oxide semiconductor film and decreases crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small changes in electrical characteristics and high reliability. Electric charge captured by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

In a transistor using the CAAC-OS film, changes in electrical characteristics due to irradiation with visible light or ultraviolet light are small, Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not observed clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film is an oxide semiconductor film having disordered atomic arrangement and no crystal part and exemplified by an oxide semiconductor film which exists in an amorphous state as quartz.

In a high-resolution TEM image of the amorphous oxide semiconductor film, crystal parts cannot be found, When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and only a halo pattern appears when the amorphous oxide semiconductor film is subjected to nanobeam electron diffraction.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is substantially equivalent to the lattice spacing (also referred to as d value) on the (009) plane, and is 0.29 nm according to crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Furthermore, the density of an oxide semiconductor varies depending on the structure in some cases. For example, when the composition of an oxide semiconductor film is determined, the structure of the oxide semiconductor can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor having a density of lower than 78% of the density of the single crystal oxide semiconductor film.

Specific examples of the above description are given. For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the sputtered particle is attached to the substrate.

Furthermore, preferably, the proportion of oxygen in the deposition gas is increased and the power is optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are given positive numbers. Here, the predetermined molar ratio of InO$_X$ powder to GaO$_Y$ powder and ZnO$_Z$ powder is, for example, 2:2:1, 8:4:3, 3:1:1, 1:1:1, 4:2:3, 2:1:3, or 3:1:2. The kinds of powders and the molar ratio for mixing powders may be determined as appropriate depending on the desired target. A CAAC-OS film formed using a target with a molar ratio of In:Ga:Zn=2:1:3 can have a particularly high proportion of regions where a diffraction pattern of CAAC-OS is observed in a predetermined area (also referred to as proportion of CAAC); thus, a transistor having a channel formation region in this CAAC-OS film can have excellent frequency characteristics.

An alkali metal is not an element included in an oxide semiconductor and thus is an impurity. Likewise, an alkaline earth metal is an impurity when the alkaline earth metal is not a component of the oxide semiconductor. When an insulating film in contact with an oxide semiconductor film is an oxide, Na, among the alkali metals, diffuses into the insulating film and becomes Na$^+$. Further, in the oxide semiconductor film, Na cuts or enters a bond between metal and oxygen which are components of the oxide semiconductor. As a result, the electrical characteristics of the transistor deteriorate; for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably 5×10$^{16}$/cm$^3$ or lower, further preferably 1×10$^{16}$/cm$^3$ or lower, still further preferably 1×10$^{15}$/cm$^3$ or lower. Similarly, the measurement value of a Li concentration is preferably 5×10$^{15}$/cm$^3$ or lower, further preferably 1×10$^{15}$/cm$^3$ or lower. Similarly, the measurement value of a K concentration is preferably 5×10$^{15}$/cm$^3$ or lower, further preferably 1×10$^{15}$/cm$^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electrical characteristics of the transistor are likely to deteriorate as in the case of using an alkali metal or an alkaline earth metal. Thus, the concentrations of silicon and carbon in the oxide semiconductor film are preferably low. Specifically, the carbon concentration or the silicon concentration measured by secondary ion mass spectrometry is 1×10$^{18}$/cm$^3$ or lower. In this case, the deterioration of the electrical characteristics of the transistor can be prevented, so that the reliability of a semiconductor device can be improved.

<Example 2 of Cross-Sectional Structure of Memory Device>

Figure 13:
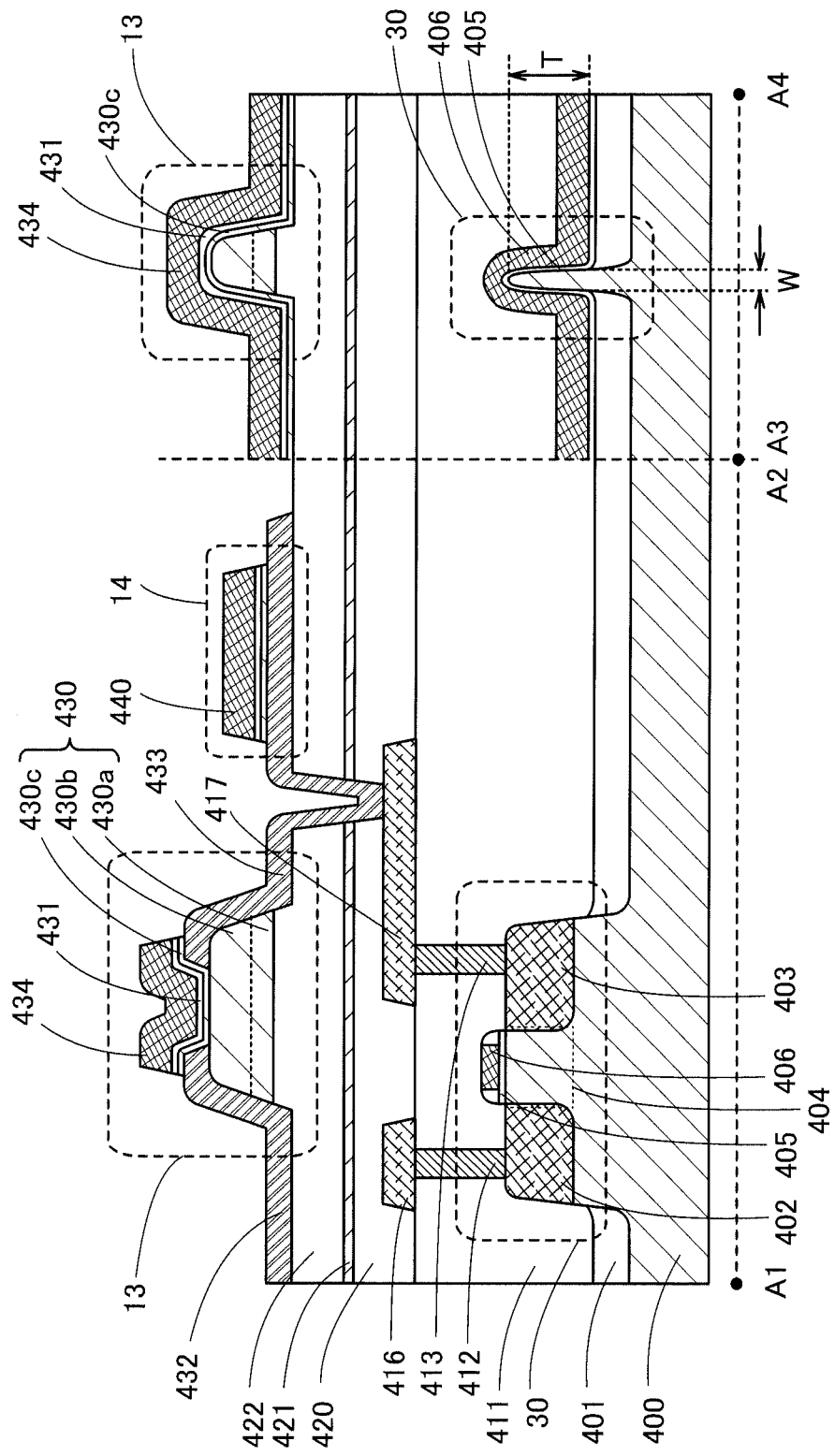
FIG. 13 illustrates a cross-sectional structure of a semiconductor device.

FIG. 13 illustrates a cross-sectional structure of a memory device according to one embodiment of the present invention, as an example. Note that FIG. 13 is a cross-sectional view of the transistor 13, the capacitor 14, and the transistor 30 included in the memory device 10 shown in FIG. 6. Specifically, a region along dashed line A1-A2 shows a structure of the transistors 13, the capacitor 14, and the transistor 30 in the channel length direction. A region along dashed line A3-A4 shows a structure of the transistors 13 and 30 in the channel width direction. In one embodiment of the present invention, the channel length direction of one transistor is not necessarily the same as the channel length direction of another transistor.

The channel length direction denotes a direction in which carriers move at the shortest distance between a pair of impurity regions serving as a source region and a drain region. The channel width direction denotes a direction perpendicular to the channel length direction in a plane parallel to a substrate.

FIG. 13 illustrates an example in which the transistor 13 including a channel formation region in an oxide semiconductor film is formed over the transistor 30 including a channel formation region in a single crystal silicon substrate.

A substrate 400 where the transistor 30 is formed can be, for example, a silicon substrate, a germanium substrate, or a silicon germanium substrate. In FIG. 13, a single crystal silicon substrate is used as the substrate 400.

The transistor 30 is electrically isolated by an element isolation method. As the element isolation method, a trench isolation method (a shallow trench isolation method: STI) or the like is used. In FIG. 13, the transistor 30 is electrically isolated by trench isolation. Specifically, in FIG. 13, the transistor 30 is electrically isolated by element isolation using an element isolation region 401 formed in such a manner that an insulator including silicon oxide or the like is buried in a trench formed in the substrate 400 by etching or the like and then the insulator is removed partly by etching or the like.

In the case where the transistor 30 has the same polarity as the adjacent transistor, element isolation between the adjacent transistors is not necessarily performed. In that case, the layout area can be reduced.

On a projection of the substrate 400 in a region other than the trench, impurity regions 402 and 403 of the transistor 30 and a channel formation region 404 positioned between the impurity regions 402 and 403 are provided. Furthermore, the transistor 30 includes an insulating film 405 covering the channel formation region 404 and a gate electrode 406 that overlaps the channel formation region 404 with the insulating film 405 provided therebetween.

In the transistor 30, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 30 can be reduced, and the number of transferred carriers in the transistor 30 can be increased. As a result, the on-state current and field-effect mobility of the transistor 30 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 30 can be further increased and the field-effect mobility of the transistor 30 can be further increased.

Note that when the transistor 30 are formed using a bulk semiconductor substrate, the aspect ratio is desirably 0.5 or more, further desirably 1 or more.

An insulating film 411 is provided over the transistor 30. Openings are formed in the insulating film 411. In the openings, conductive films 412 and 413 electrically connected to the impurity regions 402 and 403, respectively.

The conductive film 412 is electrically connected to a conductive film 416 formed over the insulating film 411. The conductive film 413 is electrically connected to a conductive film 417 formed over the insulating film 411.

An insulating film 420 is formed over the conductive films 416 and 417. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421. The transistor 13 and the capacitor 14 are provided over the insulating film 422.

The transistor 13 includes, over the insulating film 422, a semiconductor film 430 containing an oxide semiconductor, conductive films 432 and 433 that are electrically connected to the semiconductor film 430 and functions as source and drain electrodes, a gate insulating film 431 covering the semiconductor film 430, and a gate electrode 434 that overlaps with the semiconductor film 430 with the gate insulating film 431 positioned therebetween. Note that an opening is formed in the insulating films 420 to 422. The conductive film 433 is connected to the conductive film 417 in the opening.

Note that FIG. 13 illustrates an example in which the semiconductor film 430 included in the transistor 13 includes oxide semiconductor films 430a to 430c that are stacked in this order over the insulating film 422. The conductive films 432 and 433 are provided over the oxide semiconductor films 430a and 430b. The oxide semiconductor film 430c is provided between the oxide semiconductor film 430b and the gate insulating film 431 and between the conductive films 432 and 433 and the gate insulating film 431. However, in one embodiment of the present invention, the semiconductor film 430 included in the transistor 13 may be a single metal oxide film.

The capacitor 14 includes the conductive film 433, the oxide semiconductor film 430c and the gate insulating film 431 overlapping the conductive film 433, and a conductive film 440 overlapping the conductive film 433 with the oxide semiconductor film 430c and the gate insulating film 431 sandwiched therebetween. The conductive film 440 can be formed together with the gate electrode 434 by forming a conductive film over the gate insulating film 431 and processing the conductive film into a desired shape.

In the memory device shown in FIG. 13, the conductive film 417 which electrically connect the conductive film 433 serving as the source or drain electrode of the transistor 13 with the conductive film 413 serving as the source or drain electrode of the transistor 30 correspond to the wiring BLa. In addition to the conductive film, part of the conductive film 413 or part of the conductive film 433 may be included in the wiring BLa.

Note that in FIG. 13, the transistor 13 includes at least the gate electrode 434 on one side of the semiconductor film 430, and may further include a gate electrode overlapping with the semiconductor film 430 with the insulating film 422 therebetween.

When the transistor 13 includes a pair of gate electrodes, a signal for controlling an on/off state may be supplied to one of the gate electrodes, and the other of the gate electrodes may be supplied with a potential from another element. In this case, potentials with the same level may be supplied to the pair of gate electrodes, or a fixed potential such as the ground potential may be supplied only to the other of the gate electrodes. By adjusting the level of the potential supplied to the other of the gate electrodes, the threshold voltage of the transistor can be controlled.

In FIG. 13, the transistor 13 has a single-gate structure in which one channel formation region corresponding to one gate electrode 434 is provided. However, the transistor 13 may have a multi-gate structure in which a plurality of electrically connected gate electrodes is provided so that a plurality of channel formation regions is included in one active layer.

<Examples of Electronic Device>

A memory device of one embodiment of the present invention can be used for display devices, personal computers, and image reproducing devices provided with recording media (typically, devices that reproduce the content of recording media such as digital versatile discs (DVD) and have displays for displaying the reproduced images). Other than the above, as an electronic device which can be provided with the memory device according to an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical equipment, and the like can be given. FIGS. 14A to 14F each illustrate specific examples of these electronic devices.

Figure 14A:
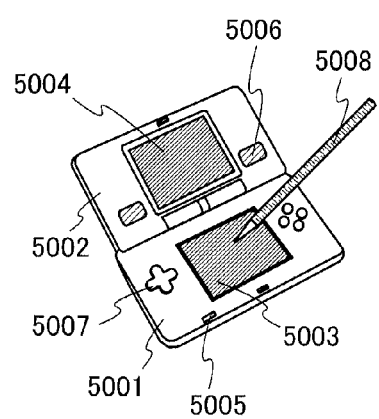
FIGS. 14A to 14F each illustrate an electronic device.

FIG. 14A illustrates a portable game console including a housing 5001, a housing 5002, a display portion 5003, a display portion 5004, a microphone 5005, speakers 5006, operation keys 5007, a stylus 5008, and the like. The memory device of one embodiment of the present invention can be used for a variety of integrated circuits included in portable game machines. Note that although the portable game console illustrated in FIG. 14A includes the two display portions 5003 and 5004, the number of display portions included in the portable game console is not limited to two.

Figure 14B:
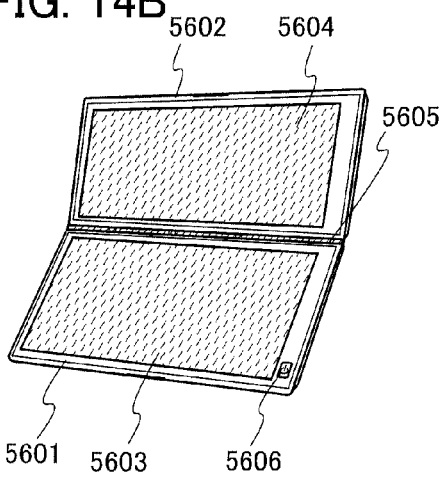

FIG. 14B illustrates a portable information terminal including a first housing 5601, a second housing 5602, a first display portion 5603, a second display portion 5604, a joint 5605, an operation key 5606, and the like. The memory device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 14C:
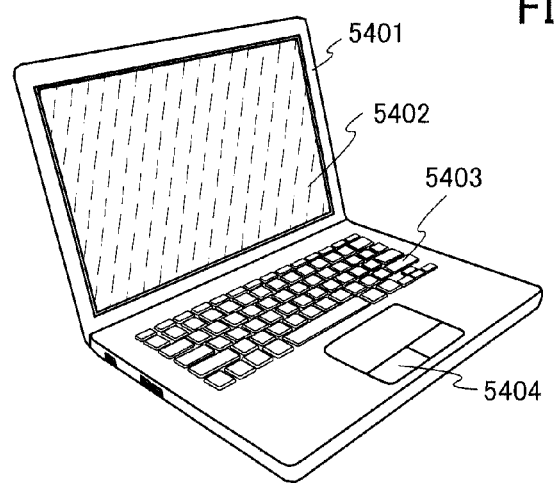

FIG. 14C illustrates a notebook computer including a housing 5401, a display portion 5402, a keyboard 5403, a pointing device 5404, and the like. The memory device of one embodiment of the present invention can be used for a variety of integrated circuits included in notebook personal computers.

Figure 14D:
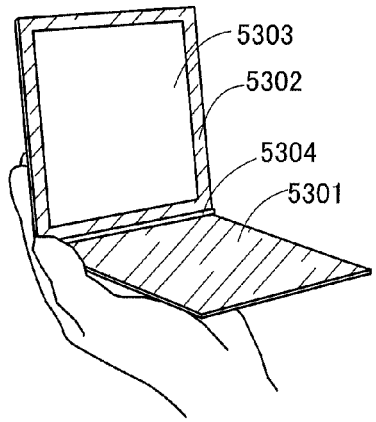

FIG. 14D illustrates a hand mirror which includes a first housing 5301, a second housing 5302, a mirror 5303, a joint 5304, and the like. The first housing 5301 and the second housing 5302 are connected with the joint 5304, and the angle between the first housing 5301 and the second housing 5302 can be changed with the joint 5304. Lighting devices are used for the first housing 5301 and the second housing 5302, The lighting device includes a planar light-emitting element. This light-emitting element may have a structure of switching between the light-emission state and the non-light-emission state in accordance with the angle between the first housing 5301 and the second housing 5302 at the joint 5304. The memory device of one embodiment of the present invention can be used for a variety of integrated circuits for controlling operation of the lighting device.

Figure 14E:
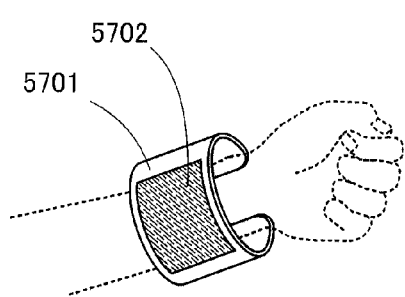

FIG. 14E illustrates a display device, which includes a housing 5701 having a curved surface, a display portion 5702, and the like. The memory device of one embodiment of the present invention can be used for a variety of integrated circuits for controlling operation of the display device used as the display portion 5702.

Figure 14F:
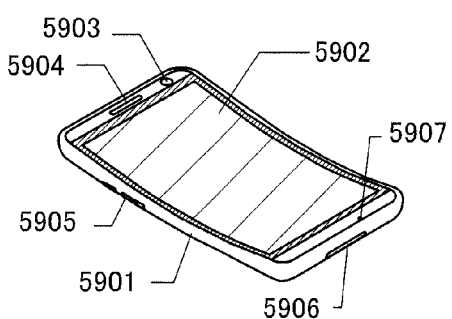

FIG. 14F illustrates a mobile phone, which includes a display portion 5902, a microphone 5907, a speaker 5904, a camera 5903, an external connection port 5906, and an operation button 5905 in a housing 5901 with a curved surface. The memory device of one embodiment of the present invention can be used for a variety of integrated circuits for controlling operation of the display device used as the display portion 5902.

Example

Example describes evaluations performed on a cell array of one embodiment of the present invention.

Figure 15A:
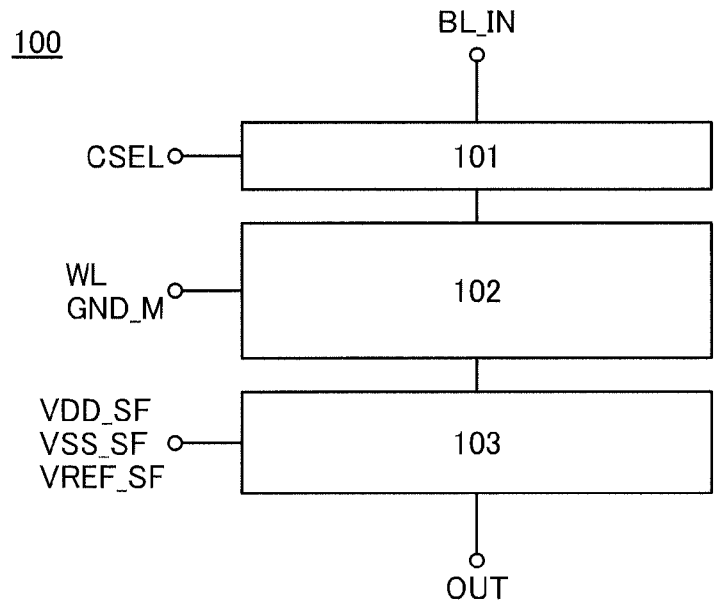
FIGS. 15A to 15C illustrate a structure of a test circuit.
Figure 19:
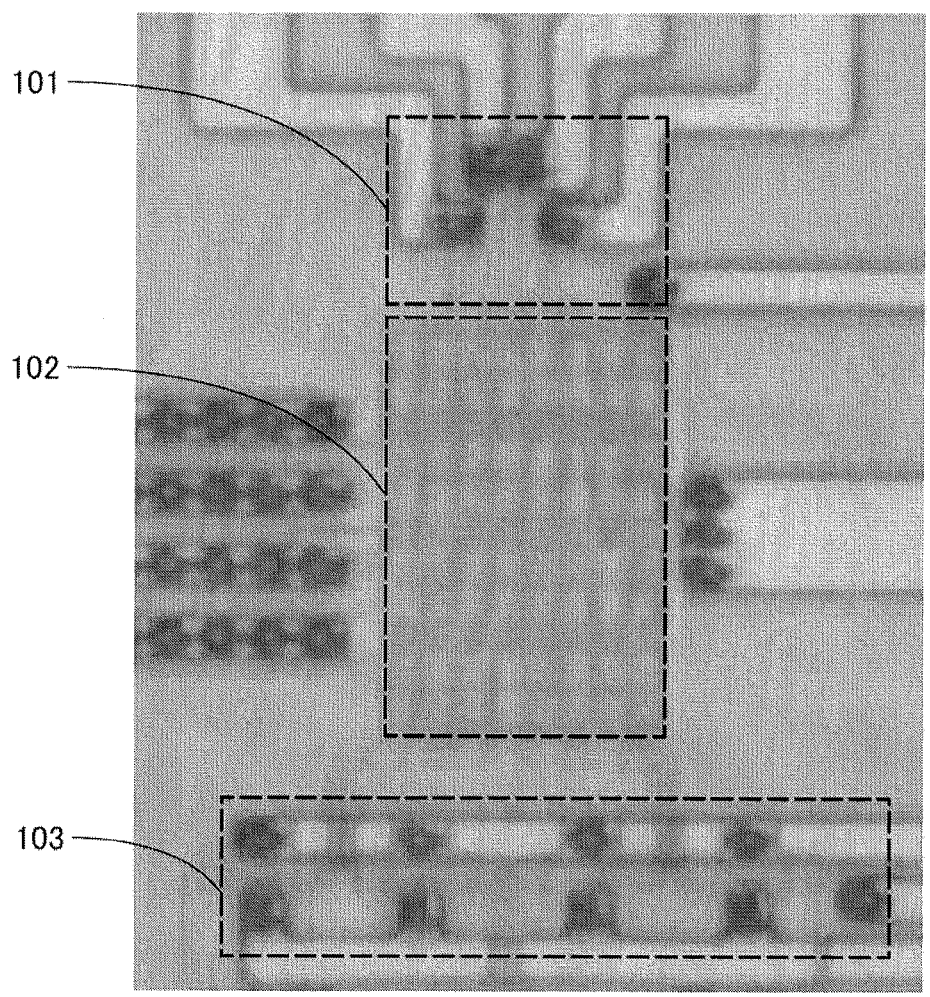
FIG. 19 illustrates a structure of a test circuit.

FIG. 15A shows a configuration of a test circuit fabricated for evaluation. A test circuit 100 includes a switch circuit 101, a cell array 102, and a source follower circuit 103. FIG. 19 is atop view of the fabricated test circuit.

Figure 15B:
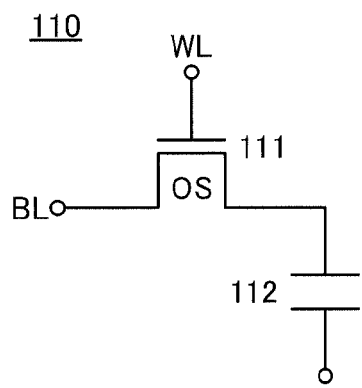

The cell array 102 includes 64 memory cells in 8 rows and 8 columns. FIG. 15B shows the configuration of the memory cell. A memory cell 110 includes a transistor 111 and a capacitor 112. In other words, the memory cell 110 includes one transistor and one capacitor, which is similar to the memory cell 12a or 12b in FIG. 1.

A transistor in which an oxide semiconductor film includes a channel formation region (hereinafter also referred to as OS transistor) was used as the transistor 111. A CAAC-OS film including IGZO was used as the oxide semiconductor film. The capacitance of the signal line BL and the capacitor 112 were 8.7 if and 3.9 if, respectively. The capacitance of 3.9 fF is one sixth of the capacitance of conventional DRAMs.

The source follower circuit 103 including the OS transistor was used for reading data so that the potentials of the signal lines of the memory cell 110 can be monitored.

Figure 16:
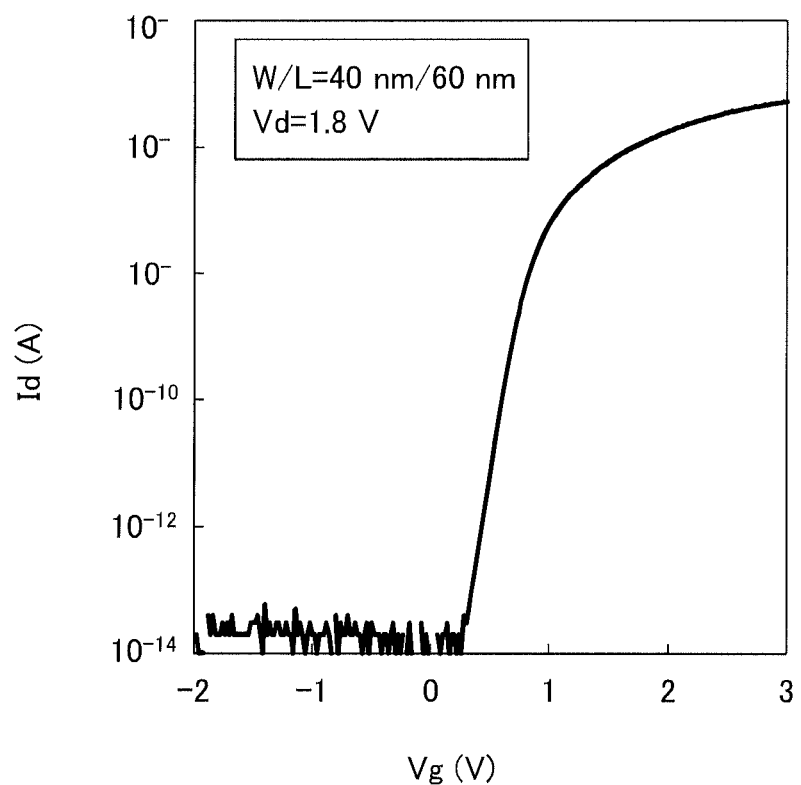
FIG. 16 shows characteristics of a transistor.

FIG. 16 shows Id-Vg characteristics of the transistor 111 including the CAAC-OS film including IGZO. Note that the channel width W and the channel length L of the transistor 111 were set to 40 nm and 60 nm, respectively. A drain voltage Vd in measurement was 1.8 V.

As shown in FIG. 16, the off-state current of the transistor 111 is smaller than the lower limit for measurement ($1\times10^{-13}$ A) and thus is extremely small. The memory cell 110 using such a transistor 111 can hold data for a very long time. As a result, the frequency of refresh operation and power consumption can be drastically reduced.

The capacitance of the capacitor 112 can also be reduced because the off-state current of the transistor 111 is small. Thus, writing and reading speed of the memory cell 110 can be increased, and high-speed operation of the memory cell 110 is achieved.

The fabricated cell array 102 is of an open-type including 8 memory cells per signal line BL. When the cell array 102 is provided over a sense amplifier like FIGS. 1 to 5, the number of sense amplifiers per chip can be increased without increasing chip area; thus, the number of memory cells per signal line BL can be reduced, and capacitance of signal lines BL can be reduced as well.

Figure 15C:
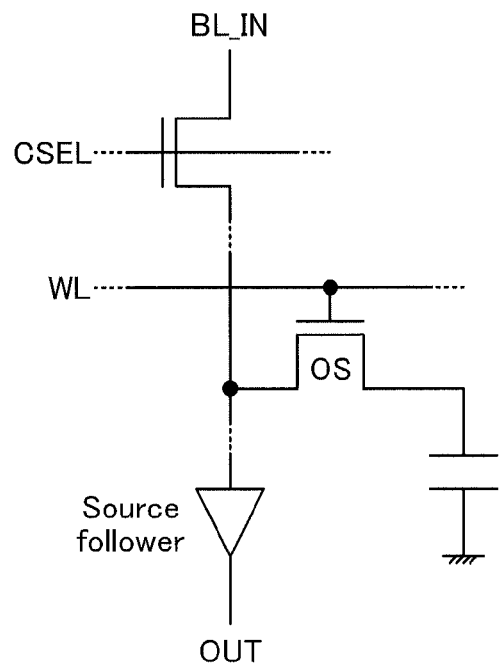
Figure 17A:
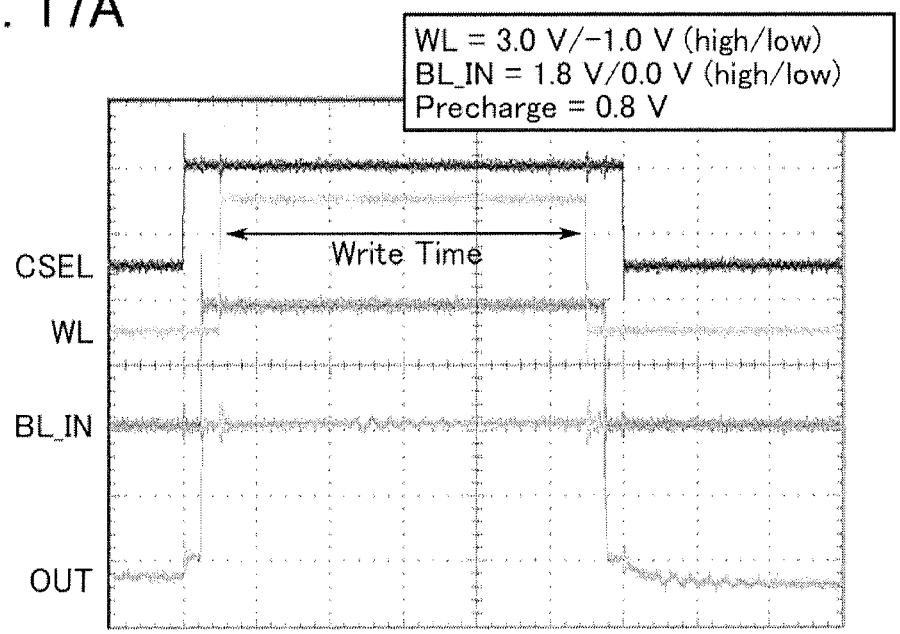
FIGS. 17A and 17B show waveforms of a test circuit.
Figure 17B:
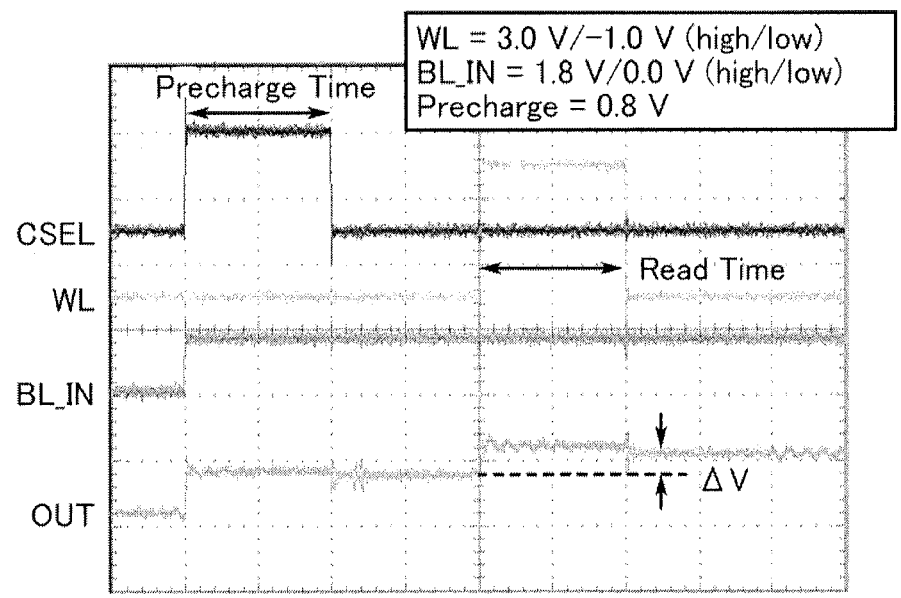

Next, evaluation results of the test circuit 100 are described. FIGS. 17A and 17B show waveforms of the signal lines CSEL, WL, BL_IN, and OUT (see FIG. 15C). FIGS. 17A and 17B show waveforms of writing data "1" and reading data "1", respectively. Here, a period during which the potential of the signal line WL is high in writing corresponds to write time, and a period during which the potential of the signal line WL is high in reading corresponds to read time. In FIG. 17B, a potential difference between the potential of the signal line BL after precharge and that after charge held in the memory cell 110 is released (i.e., after the read period) is represented as $\Delta V$.

Note that the high potential and the low potential supplied to the signal line WL were set to 3.0 V and −1.0 V, respectively. The high potential and the low potential supplied to the signal line BL_IN were set to 1.8 V and 0.0 V, respectively. The precharge potential supplied to the signal line BL was set to 0.8 V.

A read signal (signal voltage Vsig) in the signal line BL was obtained from $\Delta V$ and the source follower characteristics of the source follower circuit 103.

Figure 18A:
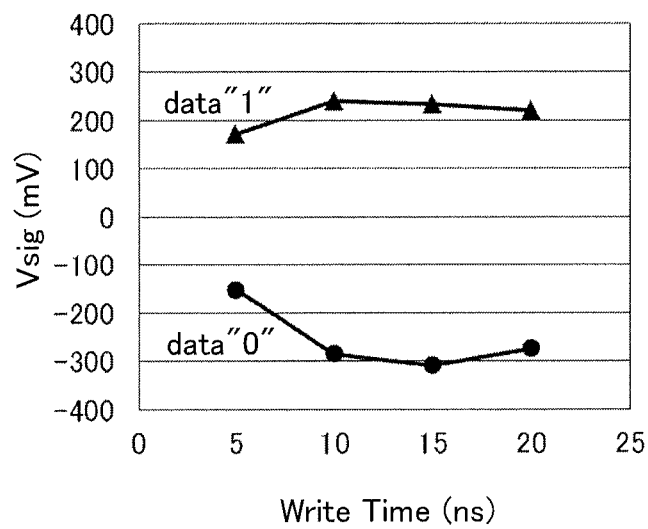
FIGS. 18A and 18B illustrate characteristics of a cell array.

The evaluation results of the operation speed of the cell array 102 will be described. FIG. 18A shows the relationship between the write time in the cell array 102 and the signal voltage Vsig. Note that $\Delta V$ corresponds to the signal voltage Vsig output via the source follower circuit 103. The results shown here is those when writing is performed and then reading was performed for the same time as the write time.

When write time and read time are 10 ns or more, Vsig is saturated and the absolute value of Vsig is 200 mV or more. This means writing is performed with no problem. The absolute value of Vsig is 100 mV or more even when write time and read time are 5 ns. The results show that the cell array 102 requires short time for writing and reading and is capable of high-speed operation.

Figure 20:
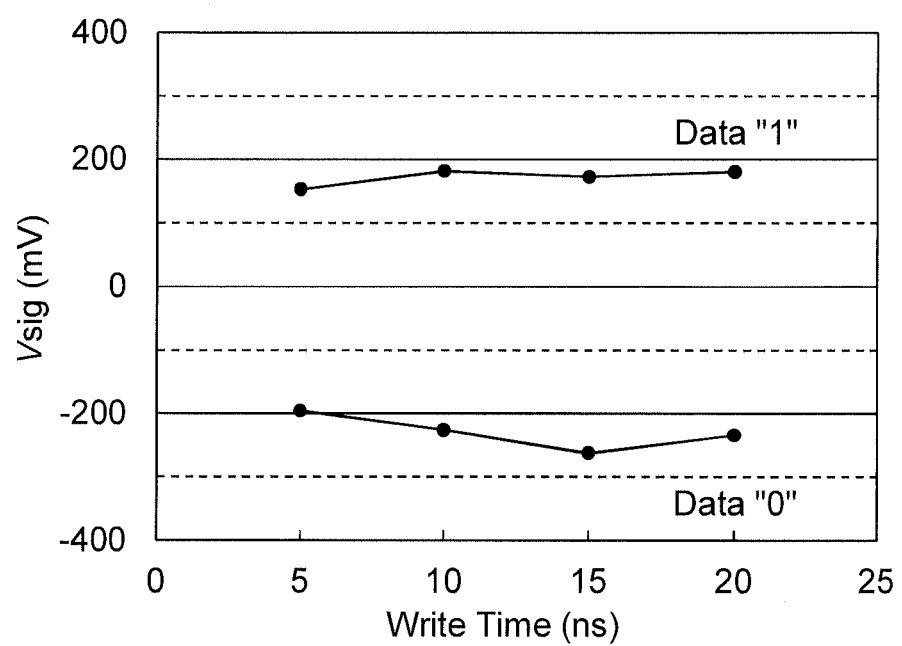
FIG. 20 illustrates characteristics of a cell array.

FIG. 20 shows average values of the voltage signal Vsig measured in 16 memory cells. As seen from FIG. 20, Vsig is saturated and the absolute value of Vsig is 150 mV or more when write time and read time are both 10 nm or more. Furthermore, the absolute value of Vsig is 150 mV or more even when write time and read time are both 5 nm or more.

Figure 18B:
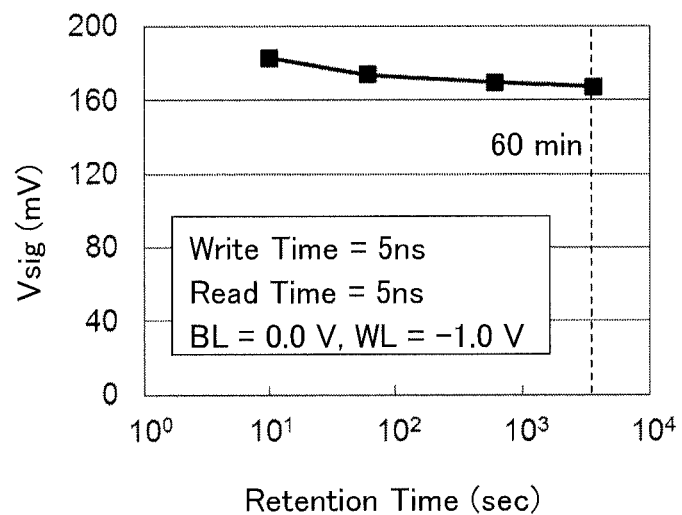

FIG. 18B shows retention characteristics of the cell array 102. The relationship between retention time of data "1" and Vsig is shown. Note that write time and read time are both 5 ns, and the potentials of the signal lines BL and WL during retention are 0.0 V and −1.0 V, respectively.

As is found from FIG. 18B, even after data is retained for an hour, Vsig is maintained at more than 160 mV and the variation of Vsig is small. The results show that the cell array 102 can maintain data for a very long time and thus the frequency of refresh operation of the cell array 102 can be drastically reduced.

Assume that the interval of refresh operation of the cell array 102 is an hour. This is approximately 56,250 times the interval of refresh operation of the conventional DRAMs (approximately 64 ms). This shows that the cell array 102 can reduce power consumed in refresh operation below approximately 1/56,250 that in the conventional DRAMs.

As described above, a semiconductor device in which data can be retained for a very long time and power consumed in refresh operation can be reduced is achieved using an OS transistor including CAAC-OS in a memory cell. Furthermore, a semiconductor device in which the capacitance of a retention capacitor is small and high-speed operation is possible can be provided.

REFERENCE NUMERALS

10: memory device, 11: sense amplifier, 11-1: sense amplifier, 11-2: sense amplifier, 11-3: sense amplifier, 11-4: sense amplifier, 12a: memory cell, 12b: memory cell, 13: transistor, 14: capacitor, 15a: region, 15b: region, 20: precharge circuit, 21: switch circuit, 22: driver circuit, 23: main amplifier, 30: transistor, 31: transistor, 32: transistor, 33: transistor, 34: transistor, 35: transistor, 36: transistor, 37: transistor, 38: transistor, 40: array, 41: cell array, 42: row decoder, 43: driver circuit, 44: memory device, 45: buffer, 46: column decoder, 47: circuit, 48: row decoder, 90: transistor, 91: insulating film, 92a: oxide semiconductor film, 92b: oxide semiconductor film, 92c: oxide semiconductor film, 93: conductive film, 94: conductive film, 95: insulating film, 96: conductive film, 97: substrate, 100: test circuit, 101: switch circuit, 102: cell array, 103: source follower circuit, 110: memory cell, 111: transistor, 112: capacitor, 400: substrate, 401: element isolation region, 402: impurity region, 403: impurity region, 404: channel formation region, 405: insulating film, 406: gate electrode, 411: insulating film, 412: conductive film, 413: conductive film, 416: conductive film, 417: conductive film, 420: insulating film, 421: insulating film, 422: insulating film, 430: semiconductor film, 430a: oxide semiconductor film, 430b: oxide semiconductor film, 430c: oxide semiconductor film, 431: gate insulating film, 432: conductive film, 433: conductive film, 434: gate electrode, 440: conductive film, 601: semiconductor substrate, 610: element isolation region, 611: insulating film, 612: insulating film, 613: insulating film, 625: conductive film, 626: conductive film, 634: conductive film, 635: conductive film, 637: conductive film, 644: conductive film, 651: conductive film, 652: conductive film, 653: conductive film, 655: conductive film, 661: insulating film, 662: gate insulating film, 663: insulating film, 701: semiconductor film, 710: region, 711: region, 721: conductive film, 722: conductive film, 731: gate electrode, 5001: housing, 5002: housing, 5003: display portion, 5004: display portion, 5005: microphone, 5006: speaker, 5007: operation key, 5008: stylus, 5301: housing, 5302: housing, 5303: mirror, 5304: connection portion, 5401: housing, 5402: display portion, 5403: keyboard, 5404: pointing device, 5601: housing, 5602: housing, 5603: display portion, 5604: display portion, 5605: connection portion, 5606: operation key, 5701: housing, 5702: display portion, 5901: housing, 5902: display portion, 5903: camera, 5904: speaker, 5905: button, 5906: external connection portion, 5907: microphone.

This application is based on Japanese Patent Application serial no. 2014-080872 filed with Japan Patent Office on Apr. 10, 2014, Japanese Patent Application serial no. 2014-092831 filed with Japan Patent Office on Apr. 28, 2014, and Japanese Patent Application serial no. 2014-180022 filed with Japan Patent Office on Sep. 4, 2014, the entire contents of which are hereby incorporated by reference.

The invention claimed is:
1. A semiconductor device comprising:
a sense amplifier;
a first circuit and a second circuit over the sense amplifier; and
a first wiring, a second wiring, a third wiring, and a fourth wiring, wherein:
the sense amplifier is electrically connected to the first wiring and the second wiring,
the first circuit is electrically connected to the first wiring and the third wiring,
the second circuit is electrically connected to the second wiring and the fourth wiring,
the first wiring intersects the third wiring and does not intersect the fourth wiring, and
the second wiring intersects the fourth wiring, and does not intersect the third wiring.

2. The semiconductor device according to claim 1, wherein:
the first circuit comprises a first transistor electrically connected to the third wiring, and a first capacitor electrically connected to the first wiring via the first transistor, and
the second circuit comprises a second transistor electrically connected to the fourth wiring, and a second capacitor electrically connected to the second wiring via the second transistor.

3. The semiconductor device according to claim 2, wherein each channel formation region of the first transistor and the second transistor comprises an oxide semiconductor.

4. The semiconductor device according to claim 3, wherein the oxide semiconductor includes indium, gallium, and zinc.

5. An electronic device comprising the semiconductor device according to claim 1.

6. A semiconductor device comprising:
a first sense amplifier and a second sense amplifier;
a first circuit, a second circuit, a third circuit and a fourth circuit over the first sense amplifier and the second sense amplifier; and
a first wiring, a second wiring, a third wiring, a fourth wiring, a fifth wiring, and a sixth wiring,
wherein:
the first sense amplifier is electrically connected to the first wiring and the second wiring,
the second sense amplifier is electrically connected to the third wiring and the fourth wiring,
the first circuit is electrically connected to the first wiring and the fifth wiring,
the second circuit is electrically connected to the second wiring and the sixth wiring,
the third circuit is electrically connected to the third wiring and the fifth wiring,
the fourth circuit is electrically connected to the fourth wiring and the sixth wiring,
each of the first wiring and the third wiring intersects the fifth wiring, and does not intersect the sixth wiring, and
each of the second wiring and the fourth wiring intersects the sixth wiring, and does not intersect the fifth wiring.

7. The semiconductor device according to claim 6, wherein:
the first circuit comprises a first transistor electrically connected to the fifth wiring and a first capacitor electrically connected to the first wiring via the first transistor,
the second circuit comprises a second transistor electrically connected to the sixth wiring, and a second capacitor electrically connected to the second wiring via the second transistor,
the third circuit comprises a third transistor electrically connected to the fifth wiring and a third capacitor electrically connected to the third wiring via the third transistor, and
the fourth circuit comprises a fourth transistor electrically connected to the sixth wiring, and a fourth capacitor electrically connected to the fourth wiring via the fourth transistor.

8. The semiconductor device according to claim 7, wherein each channel formation region of the first transistor, the second transistor, the third transistor and the fourth transistor comprises an oxide semiconductor.

9. The semiconductor device according to claim 8, wherein the oxide semiconductor includes indium, gallium, and zinc.

10. The semiconductor device according to claim 6, wherein:
each of the first circuit and the second circuit overlaps with the first sense amplifier, and
each of the third circuit and the fourth circuit overlap with the second sense amplifier.

11. The semiconductor device according to claim 6, wherein:
each of the first circuit and the third circuit overlaps with the first sense amplifier, and
each of the second circuit and the fourth circuit overlap with the second sense amplifier.

12. An electronic device comprising the semiconductor device according to claim 6.

13. The semiconductor device according to claim 1, further comprising an insulating layer with the first circuit and the second circuit thereon,
wherein:
the first wiring intersects the third wiring with the insulating layer therebetween, and
the second wiring intersects the fourth wiring with the insulating layer therebetween.

14. The semiconductor device according to claim 6, further comprising an insulating layer with the first circuit, the second circuit, the third circuit, and the fourth circuit thereon,
wherein:
each of the first wiring and the third wiring intersects the fifth wiring with the insulating layer therebetween, and
each of the second wiring and the fourth wiring intersects the sixth wiring with the insulating layer therebetween.

15. A semiconductor device comprising:
a first sense amplifier;
a first circuit and a second circuit each comprising a transistor and a capacitor; and
a first wiring, a second wiring, a third wiring, and a fourth wiring,
wherein:
the first sense amplifier is electrically connected to the first wiring and the second wiring, and overlaps with the first circuit and the second circuit,
in the first circuit, a gate of the transistor is electrically connected to the third wiring, and the capacitor is electrically connected to the first wiring via a source and a drain of the transistor,
in the second circuit, a gate of the transistor is electrically connected to the fourth wiring, and the capacitor is electrically connected to the second wiring via a source and a drain of the transistor, the first wiring intersects the third wiring, and does not intersect the fourth wiring, and the second wiring intersects the fourth wiring, and does not intersect the third wiring.

16. The semiconductor device according to claim 15, further comprising an insulating layer with the first circuit and the second circuit thereon, wherein:

the first wiring intersects the third wiring with the insulating layer therebetween, and the second wiring intersects the fourth wiring with the insulating layer therebetween.

17. The semiconductor device according to claim 15, wherein the transistor in each of the first circuit and the second circuit comprises an oxide semiconductor in a channel formation region thereof.

18. The semiconductor device according to claim 17, wherein the oxide semiconductor includes indium, gallium, and zinc.

19. An electronic device comprising the semiconductor device according to claim 15.

* * * * *